United States Patent
Kakimoto et al.

(10) Patent No.: US 10,989,603 B2
(45) Date of Patent: Apr. 27, 2021

(54) INFRARED SENSOR CHIP, AND INFRARED SENSOR EMPLOYING SAME

(71) Applicant: PANASONIC INTELLECTUAL PROPERTY MANAGEMENT CO., LTD., Osaka (JP)

(72) Inventors: Katsumi Kakimoto, Osaka (JP); Takafumi Okudo, Osaka (JP); Yosuke Hagihara, Osaka (JP); Akira Matsuura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 19 days.

(21) Appl. No.: 16/486,473

(22) PCT Filed: Feb. 15, 2018

(86) PCT No.: PCT/JP2018/005217
§ 371 (c)(1),
(2) Date: Aug. 15, 2019

(87) PCT Pub. No.: WO2018/151200
PCT Pub. Date: Aug. 23, 2018

(65) Prior Publication Data
US 2019/0383666 A1 Dec. 19, 2019

(30) Foreign Application Priority Data
Feb. 15, 2017 (JP) .............................. JP2017-026102
Mar. 3, 2017 (JP) .............................. JP2017-039984

(51) Int. Cl.
*G01J 5/16* (2006.01)
*G01J 5/04* (2006.01)
*G01J 5/20* (2006.01)

(52) U.S. Cl.
CPC ................ *G01J 5/16* (2013.01); *G01J 5/045* (2013.01); *G01J 5/20* (2013.01)

(58) Field of Classification Search
CPC ................ G01J 5/045; G01J 5/20; G01J 5/16
(Continued)

(56) References Cited

U.S. PATENT DOCUMENTS 7,825,379 B2 * 11/2010 Nakaki ..................... G01J 5/08
250/332
9,831,371 B2 * 11/2017 Dumont .................. G01J 5/20
(Continued)

FOREIGN PATENT DOCUMENTS

JP S62-009260 A 1/1987
JP 2000-308093 A 11/2000
(Continued)

OTHER PUBLICATIONS

Search Report dated Feb. 5, 2020 issued for the corresponding European Patent Application No. 18753922.6.
(Continued)

*Primary Examiner* — An H Do
(74) *Attorney, Agent, or Firm* — McDermott Will and Emery LLP

(57) ABSTRACT

The disclosure has a configuration including: a supporting substrate having a cavity; at least one bridge section extending directly above the cavity and having at least one end supported by the supporting substrate and an other end; and a thermopile wiring formed in the bridge section and including hot junctions in the bridge section and cold junctions directly above the supporting substrate, the hot junctions being connected to the cold junctions. The bridge section is provided with: at least one breakage detection wiring for detecting breakage of the bridge section; and at least one heater wiring. The breakage detection wiring is wired along
(Continued)

the thermopile wiring. The heater wiring is wired such that part of the heater wiring is in an area between the other end of the bridge section and the hot junctions.

15 Claims, 24 Drawing Sheets

(58) Field of Classification Search
USPC .......................................... 347/112, 120, 121
See application file for complete search history.

(56) References Cited

U.S. PATENT DOCUMENTS

| | | | | |
|---|---|---|---|---|
| 10,288,488 | B2* | 5/2019 | Kusukame | G01J 5/045 |
| 10,739,201 | B2* | 8/2020 | Schieferdecker | G01J 5/0884 |
| 10,794,768 | B2* | 10/2020 | Simon | G01J 5/045 |
| 2003/0111605 | A1 | 6/2003 | Sato et al. | |
| 2007/0034799 | A1 | 2/2007 | Watanabe | |
| 2010/0213374 | A1 | 8/2010 | Meinel et al. | |
| 2013/0093037 | A1 | 4/2013 | Kirihara et al. | |
| 2014/0291527 | A1 | 10/2014 | Okudo et al. | |
| 2016/0153837 | A1 | 6/2016 | Kakimoto et al. | |
| 2017/0122799 | A1 | 5/2017 | Okudo et al. | |

FOREIGN PATENT DOCUMENTS

| | | | |
|---|---|---|---|
| JP | 2000-353865 | A | 12/2000 |
| JP | 3603789 | B2 | 12/2004 |
| JP | 2007-033154 | A | 2/2007 |
| JP | 2007-134549 | A | 5/2007 |
| JP | 2010-204112 | A | 9/2010 |
| JP | 2011-027652 | A | 2/2011 |
| JP | 2011-149823 | A | 8/2011 |
| JP | 2012-226021 | A | 11/2012 |
| WO | 02/075262 | A1 | 9/2002 |
| WO | 2011/162346 | A1 | 12/2011 |
| WO | 2012/002480 | A1 | 1/2012 |
| WO | 2013/088903 | A1 | 6/2013 |
| WO | 2014/199583 | A1 | 12/2014 |

OTHER PUBLICATIONS

International Search Report and Written Opinion issued in Internationa Patent Application No. PCT/JP2018/005217 dated May 1, 2018; with partial English translation.

* cited by examiner

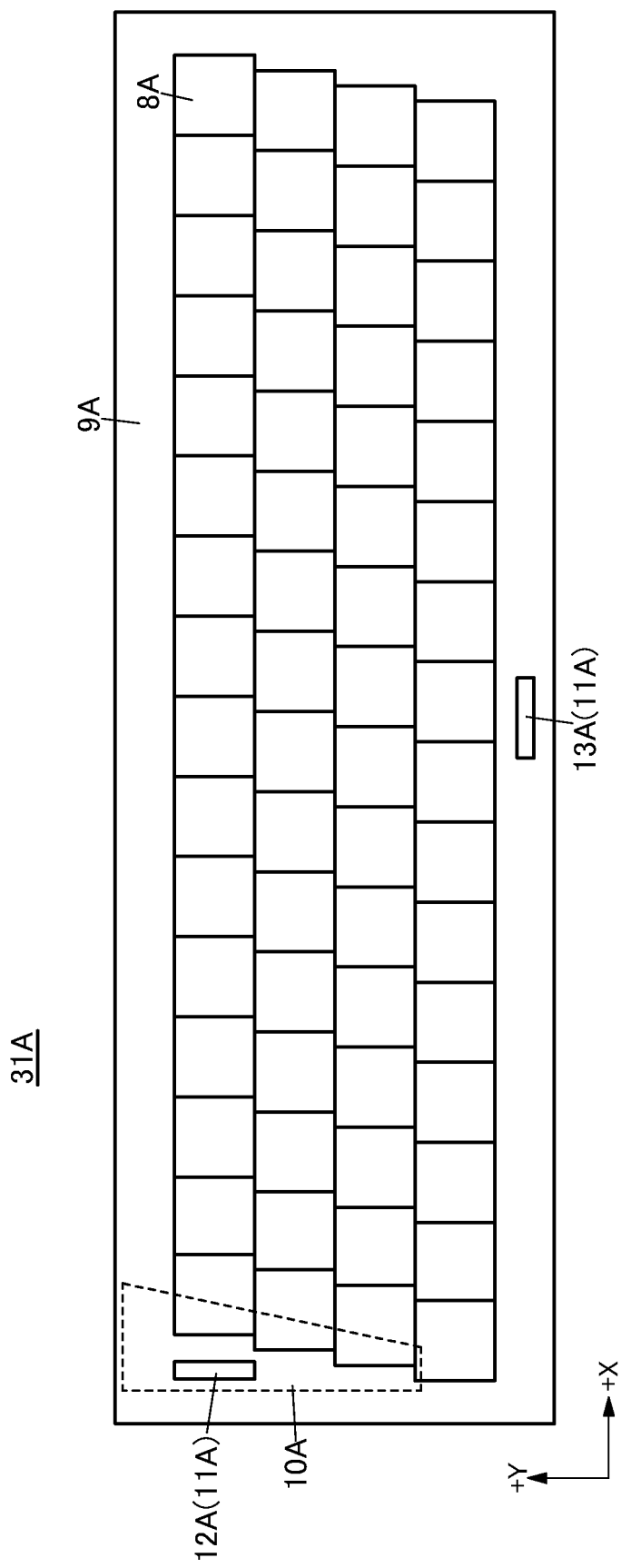

INFRARED SENSOR CHIP, AND INFRARED SENSOR EMPLOYING SAME

CROSS-REFERENCE OF RELATED APPLICATIONS

This application is the U.S. National Phase under 35 U.S.C. § 371 of International Patent Application No. PCT/JP2018/005217, filed on Feb. 15, 2018, which in turn claims the benefit of Japanese Application No. 2017-026102, filed on Feb. 15, 2017 and Japanese Application No. 2017-039984, filed on Mar. 3, 2017, the entire disclosures of which Applications are incorporated by reference herein.

TECHNICAL FIELD

The present disclosure relates to an infrared sensor chip configured to detect a temperature of an object in a non-contact manner and an infrared sensor employing the infrared sensor chip.

BACKGROUND ART

An infrared sensor has been known which includes an infrared detection element provided with a heater wiring to be able to detect breakage of a wire (Patent Literature 1).

In Patent Literature 1, however, even when breakage occurs or starts to occur in part of a bridge of the infrared detection element, the breakage cannot be accurately detected if an output of the infrared detection element does not decrease. Therefore, Patent Literature 1 has a problem that a sufficient self-diagnostic function cannot be obtained.

CITATION LIST

Patent Literature

Patent Literature 1: JP 2011-27652 A

SUMMARY OF INVENTION

It is an object of the present disclosure to provide an infrared sensor which solves the problem and which is configured to accurately perform self-diagnosis.

To solve the problem, the present disclosure describes a configuration including: a supporting substrate having a cavity; at least one bridge section extending directly above the cavity and having at least one end supported by the supporting substrate and an other end; and a thermopile wiring formed in the at least one bridge section. The thermopile wiring includes hot junctions and cold junctions. The hot junctions are connected to the cold junctions. The hot junctions are provided in the at least one bridge section. The cold junctions are provided directly above the supporting substrate. The at least one bridge section is provided with: at least one breakage detection wiring for detecting breakage of the at least one bridge section; and at least one heater wiring. The at least one breakage detection wiring is wired along the thermopile wiring. The at least one heater wiring is wired such that part of the at least one heater wiring is in an area between the other end of the at least one bridge section and the hot junctions.

BRIEF DESCRIPTION OF DRAWINGS

FIG. 16 is a top view illustrating an infrared sensor chip of a fourth embodiment;

DESCRIPTION OF EMBODIMENTS

Infrared sensors according to embodiments will be described below with reference to the drawings. Note that in each drawing, similar components are denoted by the same reference signs, and the description thereof will be omitted. Moreover, components in the embodiments may be accordingly combined with each other within a range involving no contradiction.

First Embodiment

An infrared sensor chip and an infrared sensor in a first embodiment will be described below with reference to the drawings.

Figure 1:
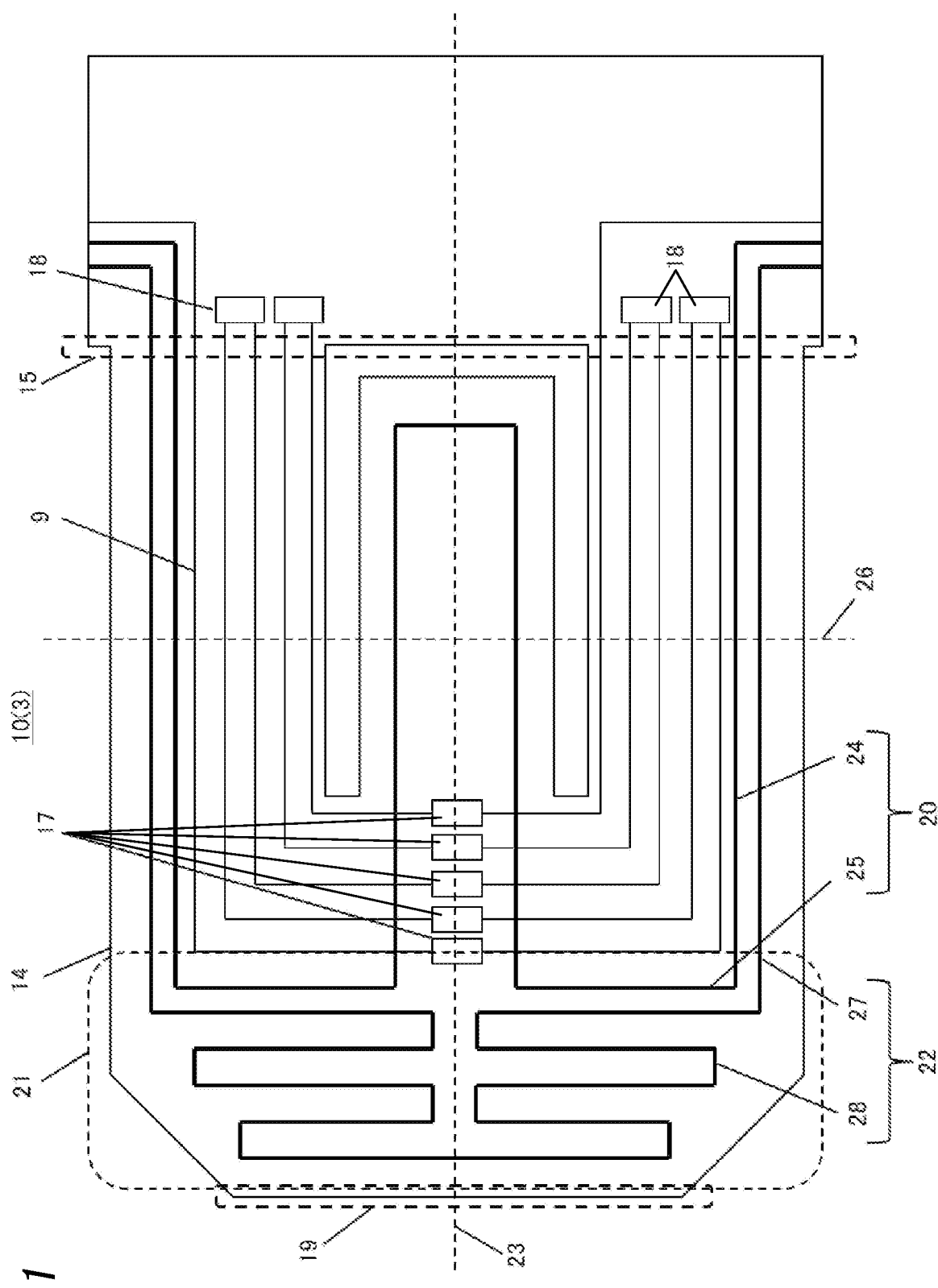
FIG. 1 is an enlarged view illustrating a bridge section of an infrared sensor chip of a first embodiment.
Figure 2:
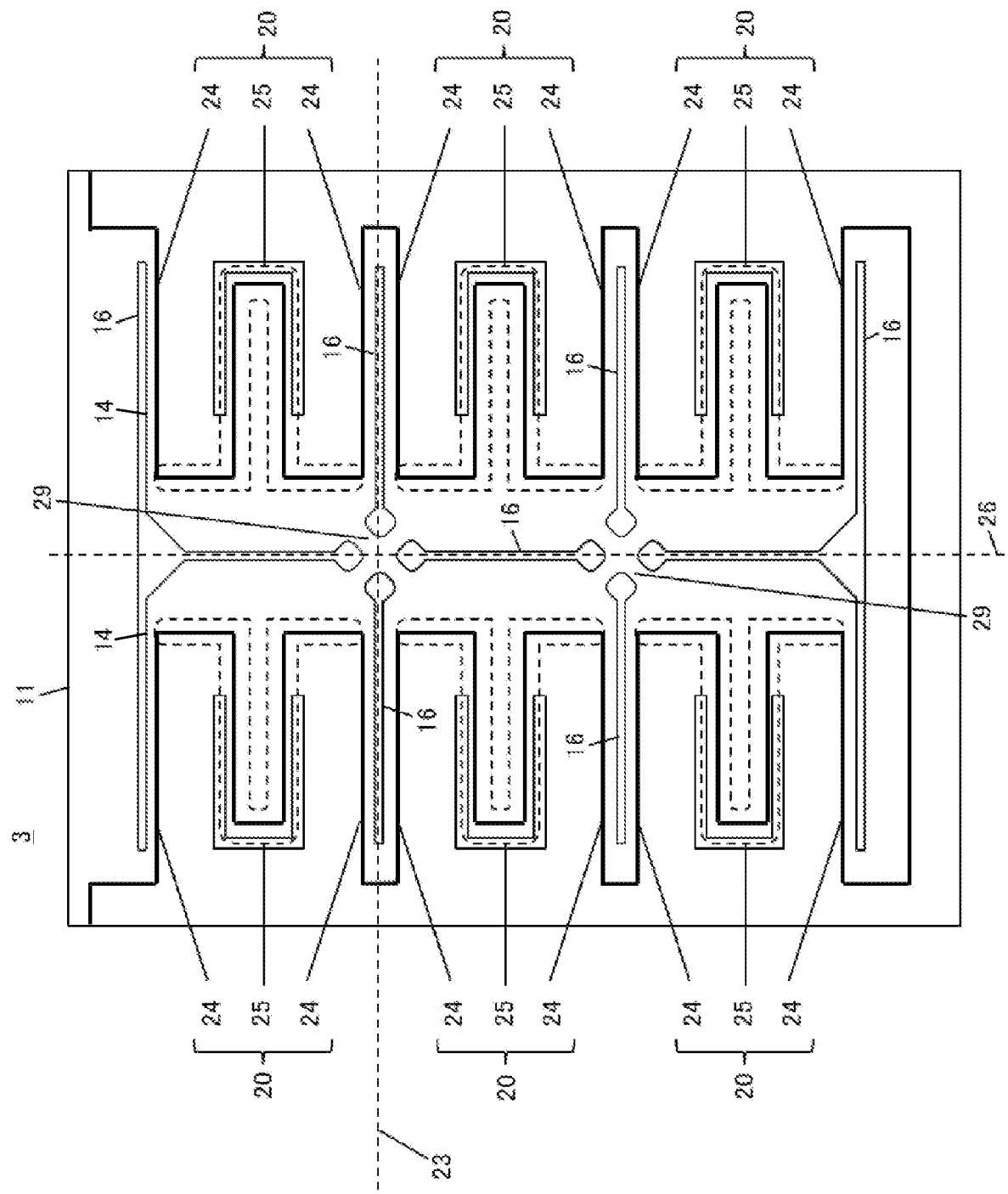
FIG. 2 is an enlarged view illustrating a pixel section of the infrared sensor chip.
Figure 3:
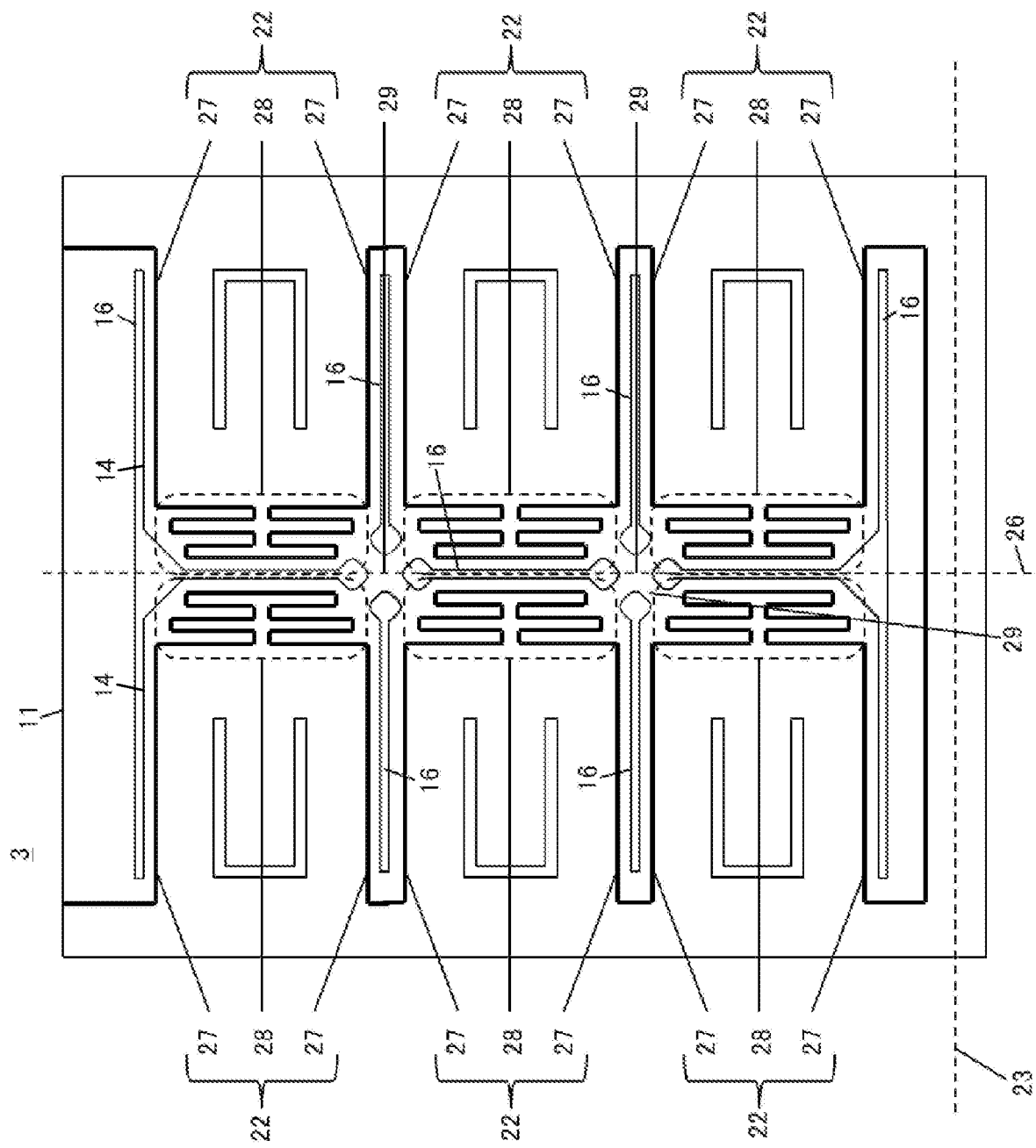
FIG. 3 is an enlarged view illustrating the pixel section of the infrared sensor chip.
Figure 4:
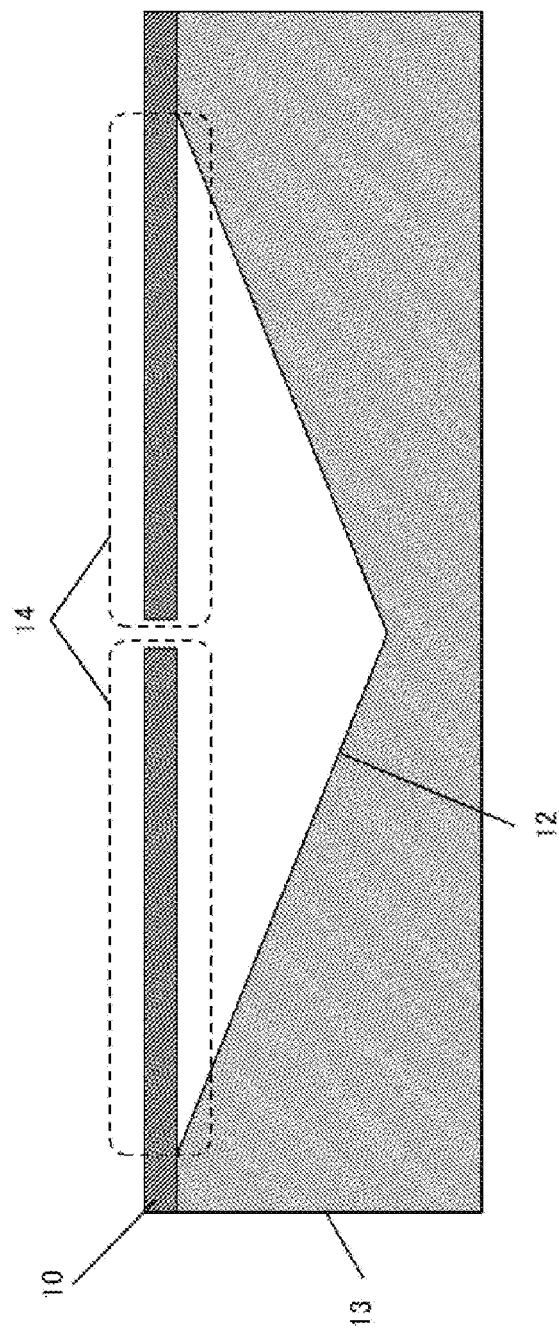
FIG. 4 is a side sectional view illustrating the pixel section of the infrared sensor chip.
Figure 5:
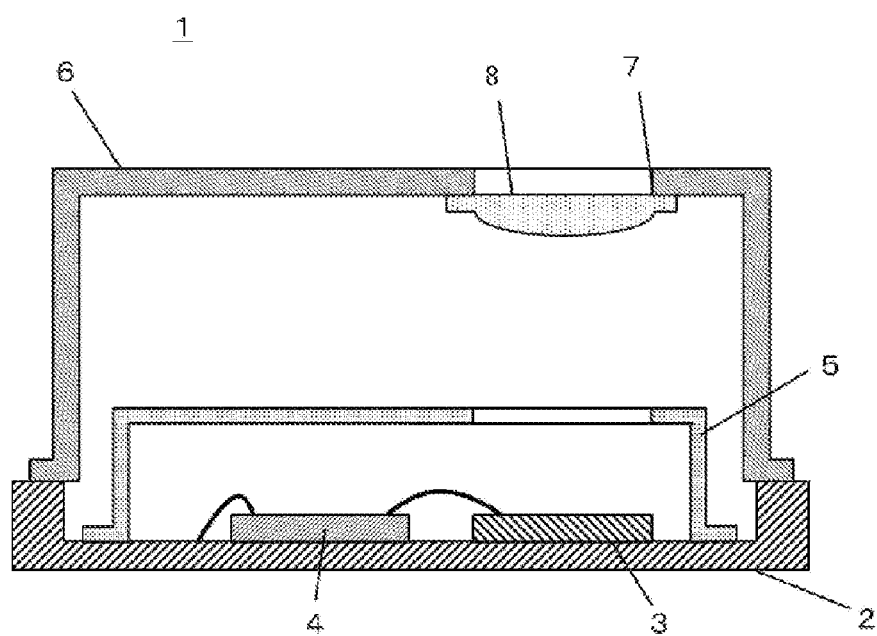
FIG. 5 is a side sectional view illustrating an infrared sensor including the infrared sensor chip.
Figure 6:
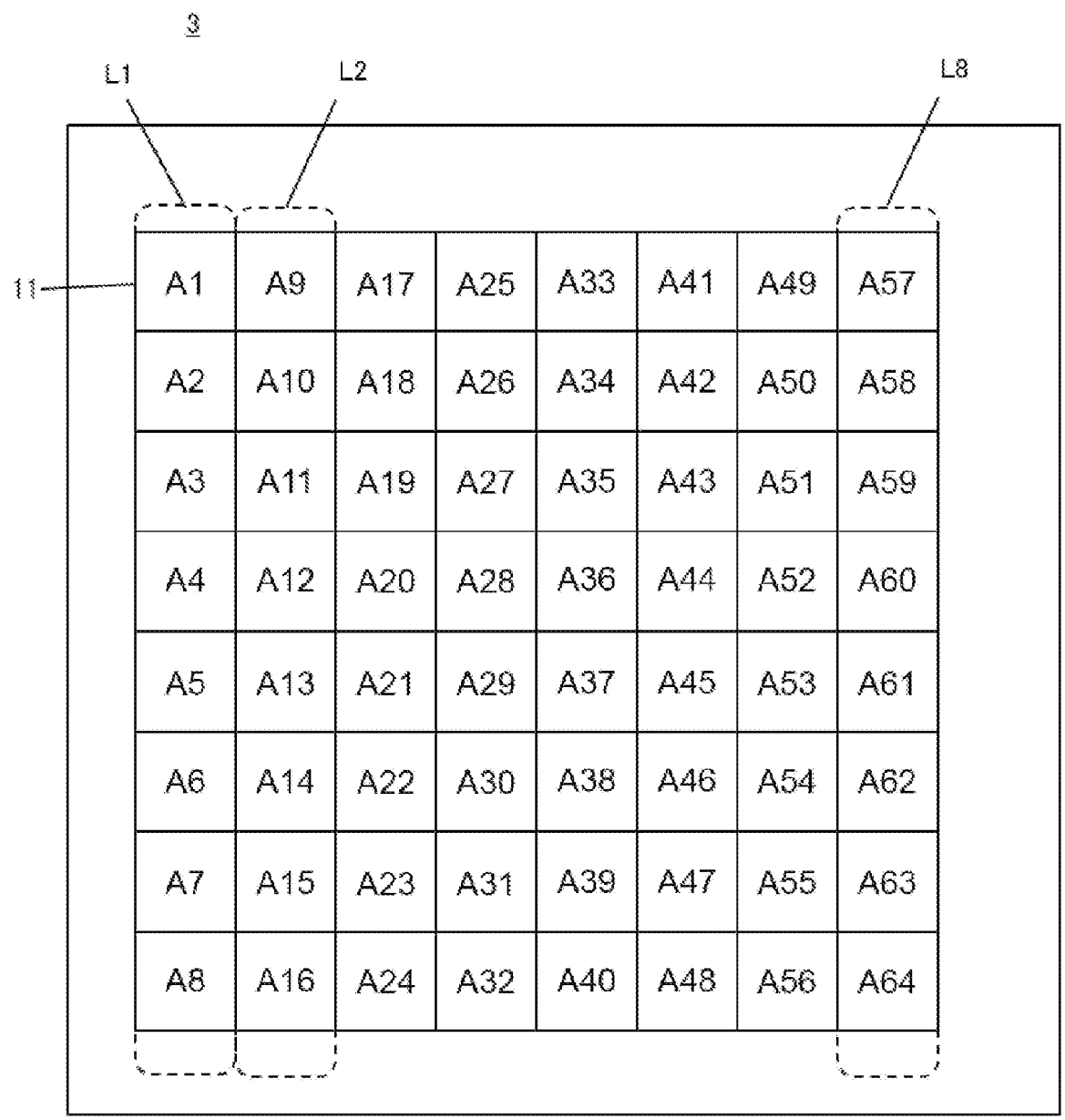
FIG. 6 is a top view illustrating an arrangement of pixel sections of the infrared sensor chip.
Figure 7:
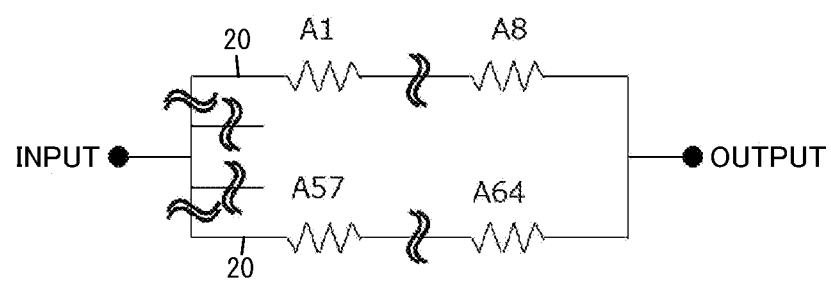
FIG. 7 is an equivalent circuit diagram illustrating breakage detection wirings of the infrared sensor.
Figure 8:
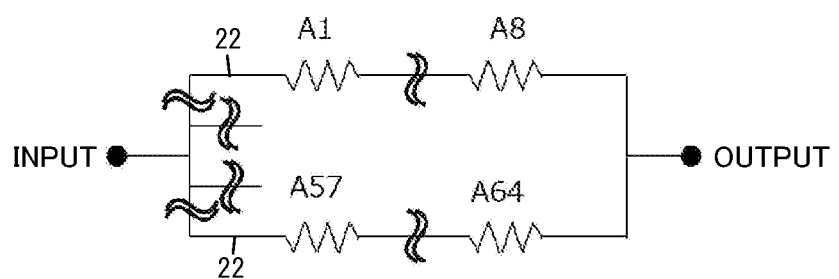
FIG. 8 is an equivalent circuit diagram illustrating heater wirings of the infrared sensor.

FIG. 1 is an enlarged view illustrating a bridge section of an infrared sensor chip of the first embodiment. FIGS. 2 and 3 are enlarged views each illustrating a pixel section of the infrared sensor chip. FIG. 4 is a side sectional view illustrating the pixel section of the infrared sensor chip. FIG. 5 is a side sectional view illustrating an infrared sensor including the infrared sensor chip. FIG. 6 is a top view illustrating an arrangement of pixel sections of the infrared sensor chip. FIG. 7 is an equivalent circuit diagram illustrating breakage detection wirings of the infrared sensor. FIG. 8 is an equivalent circuit diagram illustrating heater wirings of the infrared sensor.

As illustrated in FIG. 5, an infrared sensor 1 includes a base 2, an infrared sensor chip 3 provided on the base 2, a process circuit 4 configured to process an output of the infrared sensor chip 3, a cap 5 provided on the base 2, and a package 6 covering the infrared sensor chip 3, the process circuit 4, and the cap 5. In the front of the infrared sensor 1, the package 6 has an opening 7, and the opening 7 is covered with a lens 8. Note that for the sake of description, a direction in which infrared radiation enters the infrared sensor chip 3 is defined as the front.

The base 2 is formed of a substrate of a sintered body made of, for example, alumina. On the base 2, pads (not shown) for electrical connection is provided. The infrared sensor chip 3 is electrically connected to the process circuit 4 via the pads and bonding wires provided on the base 2.

The package 6 is formed of a metal material such as ion or SUS and includes a layer plated with nickel. The package 6 has a through hole (the opening 7) in front of the infrared sensor chip 3. The lens 8 is disposed to cover the through hole. The space in the package 6 has a dry atmosphere filled with nitrogen. The atmosphere in the space covered with the package 6 is not limited to this embodiment but may be, for example, a vacuum atmosphere. When the space covered with the package 6 has the vacuum atmosphere, a getter on which remaining gas and the like is adsorbed is at least disposed in the space. As a material for the getter, a non-evaporation getter made of, for example, a zirconium alloy and/or a titanium alloy is at least adopted.

The lens 8 adopts an aspherical surface lens made of a semiconductor material. Adopting an aspherical surface lens 8 as the lens 8 enables the focal length and the aberration of the lens 8 to be reduced even with a large diameter of the aperture in the lens 8. Thus, reducing the focal length of the lens 8 realizes a reduction of the thickness of the package 6.

The cap 5 is formed of a material such as iron or SUS and includes a layer plated with nickel. The cap 5 has a through hole in front of the infrared sensor chip 3. The cap 5 surrounds lateral sides of the infrared sensor chip 3 and the process circuit 4 to be able to reduce the influence of an interference noise over the infrared sensor chip 3.

The circuit configuration of the process circuit 4 is at least accordingly designed depending on the type or the like of the infrared sensor chip 3 and may be a circuit configuration including, for example, a control circuit for controlling the infrared sensor 1, an amplifier circuit for amplifying an output voltage of the infrared sensor chip 3, and a multiplexer for selectively inputting, into the amplifier circuit, one of output voltages output from the infrared sensor chip 3 to a plurality of pads.

As illustrated in FIG. 1, the infrared sensor chip 3 has a thin film structure section 10. In the thin film structure section 10, a temperature sensor is embedded. The temperature sensor is a thermoelectric converter. The thermoelectric converter includes a thermopile wiring 9. The thermopile wiring 9 converts thermal energy generated from infrared radiation into electrical energy. The infrared radiation is output from an object serving as a measurement target. The infrared sensor 1 further includes a×b (each of a and b is a natural number) pixel sections 11 on one surface of the semiconductor substrate. The pixel sections 11 are arranged in a two-dimensional array including "a" rows and "b" columns. Each pixel section 11 includes a temperature sensor and a MOS transistor for extracting an output voltage of the temperature sensor. Note that the number of pixel sections 11 is at least determined to satisfy the relationships a≥2 and b≥2. The pixel sections 11 in the first embodiment are arranged in an 8×8-array as illustrated in FIG. 6. Note that the pixel sections 11 do not necessarily have to be arranged in the 8×8-array but may be arranged in, for example, a 16×4-array depending on a usage of the infrared sensor 1.

As illustrated in FIGS. 1 and 2, each pixel section 11 includes a supporting substrate 13 having a cavity 12, the thin film structure section 10 supported by an upper surface of the supporting substrate 13, and the temperature sensor. The thermopile wiring 9 is provided in the thin film structure section 10 and is the temperature sensor includes thermopile elements connected in series. Note that for the sake of description, a direction in which a surface of the supporting substrate 13 has the cavity 12 is defined as an upward direction, but this structure should not be construed as limiting. The thin film structure section 10 has a layered structure including: a silicon oxide film (not shown) supported by the upper surface of the supporting substrate 13; a silicon nitride film (not shown) formed on the silicon oxide film; an interlayer insulation film (not shown) formed on the silicon nitride film and including a boron phosphorus silicon Glass (BPSG) film; and a passivation film (not shown) including a layered film of a phosphosilicate glass (PSG) film formed on the interlayer insulation film and a non-doped silicate glass (NSG) film formed on the PSG film. On the silicon nitride film, the temperature sensor is formed, and the temperature sensor is covered with the interlayer insulation film on a surface of the silicon nitride film. As illustrated in FIG. 2, each pixel section 11 includes six bridge sections 14 arranged in a 2×3-array. Each bridge section 14 is included in the thin film structure section 10 directly above the cavity 12. Each bridge section 14 is provided with the thermopile wiring 9. Thus, each bridge section 14 has one end 15 supported by the supporting substrate 13. Moreover, each two adjacent bridge sections 14 are separated by a slit 16. Note that the number of bridge sections 14 may be changed in accordance with an application or the like of the infrared sensor 1.

The bridge section 14 is provided directly above the cavity 12 and is thus thermally insulated from the supporting substrate 13. The thermopile wirings 9 are connected in series, each of which is in a corresponding one of the bridge sections 14. Note that depending on an application or the like of the infrared sensor 1, the thermopile wirings 9 may be connected in parallel, or a set of the thermopile wirings 9 connected in series to each other may be connected in parallel to a set of the thermopile wirings 9 connected in series to each other. Each of the thermopile wirings 9 is in a corresponding one of the bridge sections 14. It is possible to increase sensitivity as compared to a case where an output is individually extracted from each thermopile wiring 9. The thermopile wirings 9 are formed on the silicon nitride film. Each thermopile wiring 9 includes a plurality of thermocouples formed by electrically coupling one end of an n-type polysilicon layer to one end of a p-type polysilicon layer by a metal material such as Al—Si on a side facing a plane of incidence of infrared radiation. The n-type polysilicon layer and the p-type polysilicon layer are elongated and extend on both the bridge section 14 and a part of the thin film structure section 10, the part being located above the supporting substrate 13. Moreover, in each thermopile wiring 9, the other end of the n-type polysilicon layer and the other end of the p-type polysilicon layer of the thermocouples adjacent to each other on the upper surface of the supporting substrate 13 are coupled and electrically connected by a metal material such as Al—Si. As illustrated in FIG. 1, the one end of the n-type polysilicon layer, the one end of the p-type polysilicon layer, and the metal material form a hot junction 17, and the other end of the n-type polysilicon layer, the other end of the p-type polysilicon layer, and the metal material form a cold junction 18. Thus, each hot junction 17 is formed at a location overlapping the cavity 12, and each cold junction 18 is formed at a location overlapping the supporting substrate 13. Each bridge section 14 is provided with a breakage detection wiring 20 and a heater wiring 22. The breakage detection wiring 20 is wired along the thermopile wiring 9. The heater wiring 22 is wired to extend through an area 21 between the hot junction 17 and the other end 19 of each bridge section 14. The breakage detection wiring 20 and the heater wiring 22 are wired to extend in the vicinity of the hot junction 17.

FIG. 2 is a view illustrating only wiring of the breakage detection wirings 20. As illustrated in FIG. 2, the breakage detection wires 20 are connected to a breakage processing circuit (not shown), and while the infrared sensor 1 detects a temperature of the measured body, each breakage detection wiring 20 always detects a resistance change during driving of the infrared sensor 1. As illustrated in FIG. 1, each breakage detection wiring 20 is wired to extend along the thermopile wiring 9 and is configured to detect breakage of the infrared sensor chip 3 based on the resistance change. Each breakage detection wiring 20 includes two first wiring sections 24 and a second wiring section 25. The two first wiring sections 24 are wired to extend along a first direction 23 in which the one end 15 and the other end 19 of the bridge section 14 are aligned. The second wiring section 25 is located between ends of the two first wiring sections 24, the ends being located in the area 21. The two first wiring sections 24 extend along side edges of the bridge section 14. The first wiring sections 24 are made of polysilicon. The second wiring section 25 extends in a second direction 26 orthogonal to the first direction 23. Part of the second wiring section 25 extends across the thermopile wiring 9 and is wired between the two thermopile wirings 9. That is, the second wiring section 25 includes two first portions, two second portions, and a third portion. The two first portions extend in the second direction 26 and are connected to the two first wiring sections 24 in the area 21. The two second portions are connected to ends of the two first portions extending in the first direction 23 across the thermopile wiring 9. The third portion extends in the second direction 26 and connects the two second portions at the one end 15 of the bridge section 14. The breakage detection wiring 20 straddles the thermopile wirings 9, and the breakage detection wiring 20 is wired also between the thermopile wirings 9, which extends a range in which breakage of the infrared sensor chip 3 is detectable. Thus, detection accuracy of the breakage of the infrared sensor 1 is improved. Moreover, of the second wiring section 25, portions (the first portions) extending in the second direction 26 are made of polysilicon, and a portion (part of the second portion) straddling the thermopile wirings 9 and portions (remaining part of the second portion and the third portion) located between the two thermopile wirings 9 are made of metal such as aluminum. The entirety of the second wiring section 25 may be made of polysilicon. However, when of the second wiring section 25, the portion straddling the thermopile wirings 9 and the portions located between the thermopile wirings 9 are made of aluminum, it is possible to wire the second wiring section 25 also between the thermopile wirings 9 without increasing the number of fabricating processes of the infrared sensor chip 3. Note that the breakage detection wiring 20 is, except for the portions located between the thermopile wirings 9, made of polysilicon, and a resistive material formable in a semiconductor process is used, and therefore, the breakage detection wiring 20 is cost-effectively manufacturable. Moreover, the breakage detection wiring 20 formed in the bridge section 14 is connected in series to a breakage detection wiring 20 wired in another bridge section 14 adjacent to the bridge section 14 and is connected in series to all the breakage detection wirings 20 in the six bridge sections 14 in one pixel section 11. Thus, simply providing the pixel section 11 with two terminals (not shown) for connection to the breakage detection wirings 20 enables breakage to be detected. Thus, when breakage of any bridge section 14 occurs in the pixel section 11, the breakage is detectable by 2-terminal connection.

FIG. 3 is a view illustrating only wiring of the heater wirings 22. As illustrated in FIG. 3, the heater wirings 22 are connected to a heater process circuit (not shown), and when the infrared sensor 1 is activated, prescribed electric power is applied to the heater wirings 22 to generate Joule heat, thereby increasing the temperature of the hot junction 17 to check the sensitivity of the infrared sensor 1. Each heater wiring 22 includes a lead line section 27 and a heater section 28. The lead line section 27 extends in the first direction 23. The heater section 28 is connected to (an end of the bridge section 14 at the other end 19 of) the lead line section 27 and is wired in the area 21. The lead line section 27 is made of metal such as aluminum. The heater section 28 is made of polysilicon. The entirety of the heater wiring 22 may be made of polysilicon. However, making the lead line section 27 of aluminum enables energy loss at sections other than the heater section 28 to be reduced and the heater section 28 to be efficiently heated. Moreover, the heater section 28 is wired to meander in the second direction 26. When the heater section 28 meanders, the resistance value of the heater section 28 increases, which enables Joule heat to be efficiently generated. Note that the heater section 28 meanders in the second direction 26, but this embodiment should not be construed as limiting. The heater section 28 may be wired to meander in the first direction 23. Alternatively, meandering of only part of the heater section 28 enables the resistance value to be increased. The heater wiring 22 is formed to increase the resistance of the heater section 28, and therefore, the resistance of the heater section 28 is higher than the resistance of the second wiring section 25. As described above, the heater wiring 22 formed in the bridge section 14 is connected in series to the heater wiring 22 formed in another adjacent bridge section 14. Thus, the heat generation efficiency in the heater section 28 is improved, and overheating by the 2-terminal connection is possible. At an end in a column direction of the pixel section 11, the breakage detection wiring 20 and the heater wiring 22 are wired from a side at the one end 15 of the bridge section 14 to extend over the supporting substrate 13 and further extend through the supporting substrate 13 so as to be connected to the breakage detection wiring 20 and the heater wiring 22 in the bridge section 14 of an opposite column.

The bridge sections 14 are coupled by a joint piece 29 having a cross shape in plan view. The joint piece 29 is located among four bridge sections 14, namely, adjacent bridge sections 14 and two bridge sections which face the adjacent bridge sections 14 and which are adjacent to each other.

With reference to FIGS. 6, 7, and 8, wiring of the breakage detection wiring 20 and the heater wiring 22 between the pixel sections 11 will be described. For the sake of description, the pixel sections 11 are denoted by A1, A2, . . . A64 from the top left in FIG. 6. Moreover, in the figure, the pixel sections 11 aligned in the vertical direction are pixel sections in the same column, and the columns are denoted by L1, L2, . . . L8 from the left in the figure. As illustrated in FIG. 7, in the plurality of pixel sections 11 arranged in an array, the breakage detection wirings 20 in the pixel sections 11 adjacent to each other in an identical column are connected in series to each other, and the breakage detection wirings 20 in the pixel sections 11 in the columns adjacent to each other are connected in parallel to each other. That is, the breakage detection wirings 20 in the pixel sections 11 which are denoted by A1 to A8 and which belong to the column L1 are connected in series to each other, and the breakage detection wirings 20 in the pixel sections 11 in the column L1 are connected in parallel to the respective breakage detection wirings 20 in the pixel sections 11 in the column L2. When the breakage detection wirings 20 are connected as described above, the 2-terminal connection enables breakage of any pixel section 11 of all the pixel sections 11 to be detected. Moreover, as illustrated in FIG. 8, in the pixel sections 11 arranged in the array, the heater wirings 22 in an identical column are connected in series to each other, and the heater wirings 22 in the pixel sections 11 the columns adjacent to each other are connected in parallel to each other. That is, for example, the heater wirings 22 in in the pixel sections 11 which are denoted by A1 to A8 and which belong to the column L1 are connected in series to each other, and the heater wirings 22 in the pixel sections 11 in the column L1 are connected in parallel to the respective heater wirings 22 in the pixel sections 11 in the column L2. This improves the heat generation efficiency in the heater sections 28 in all of the pixel sections 11, and the 2-terminal connection enables the heater sections 28 to be heated.

The infrared sensor chip 3 is provided with the breakage detection wiring 20 and the heater wiring 22 and can thus accurately perform self-diagnosis of the infrared sensor chip 3. Thus, the infrared sensor 1 of the first embodiment can accurately perform the self-diagnosis.

Figure 9:
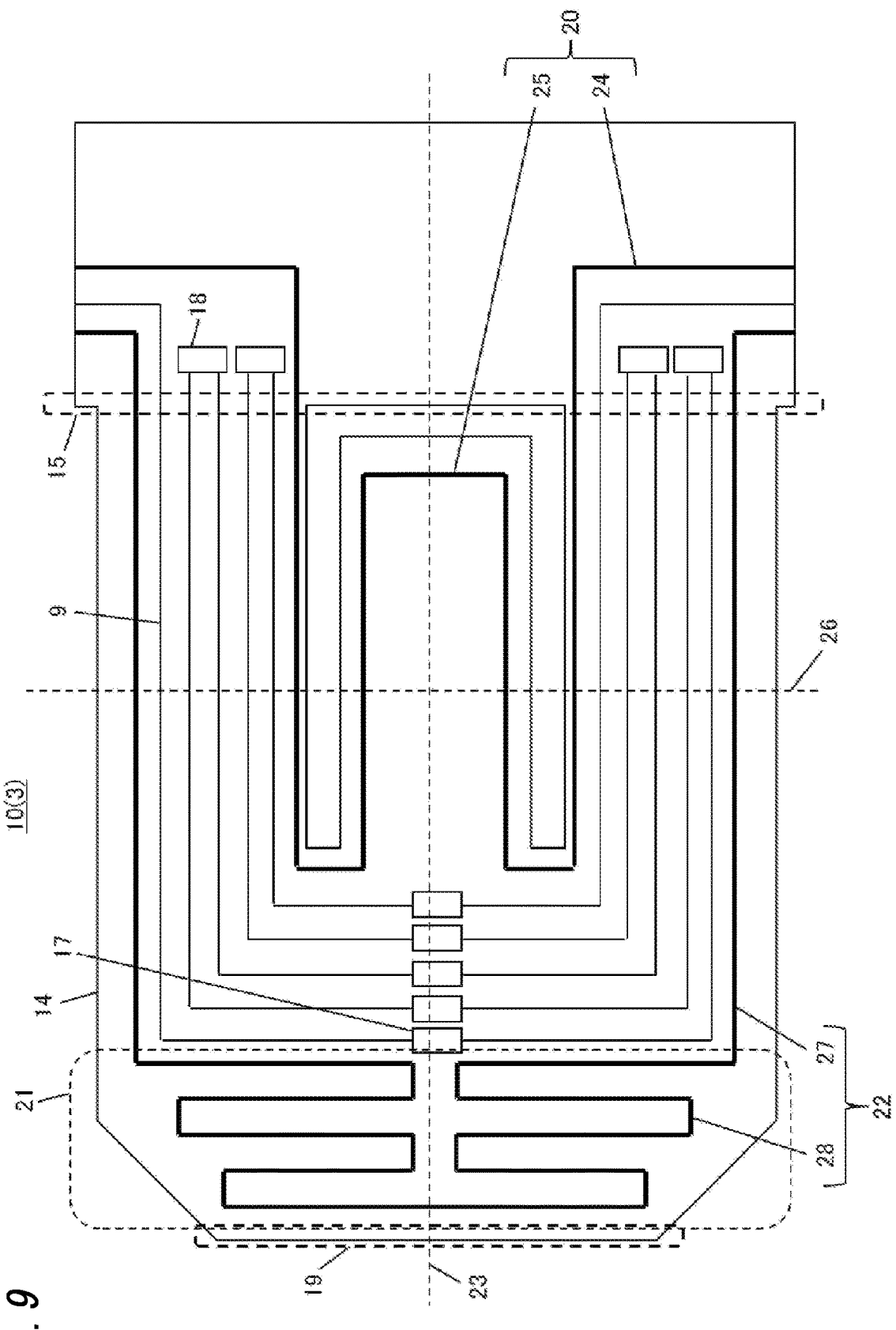
FIG. 9 is a view illustrating a variation of wiring of the breakage detection wiring of the infrared sensor.
Figure 10:
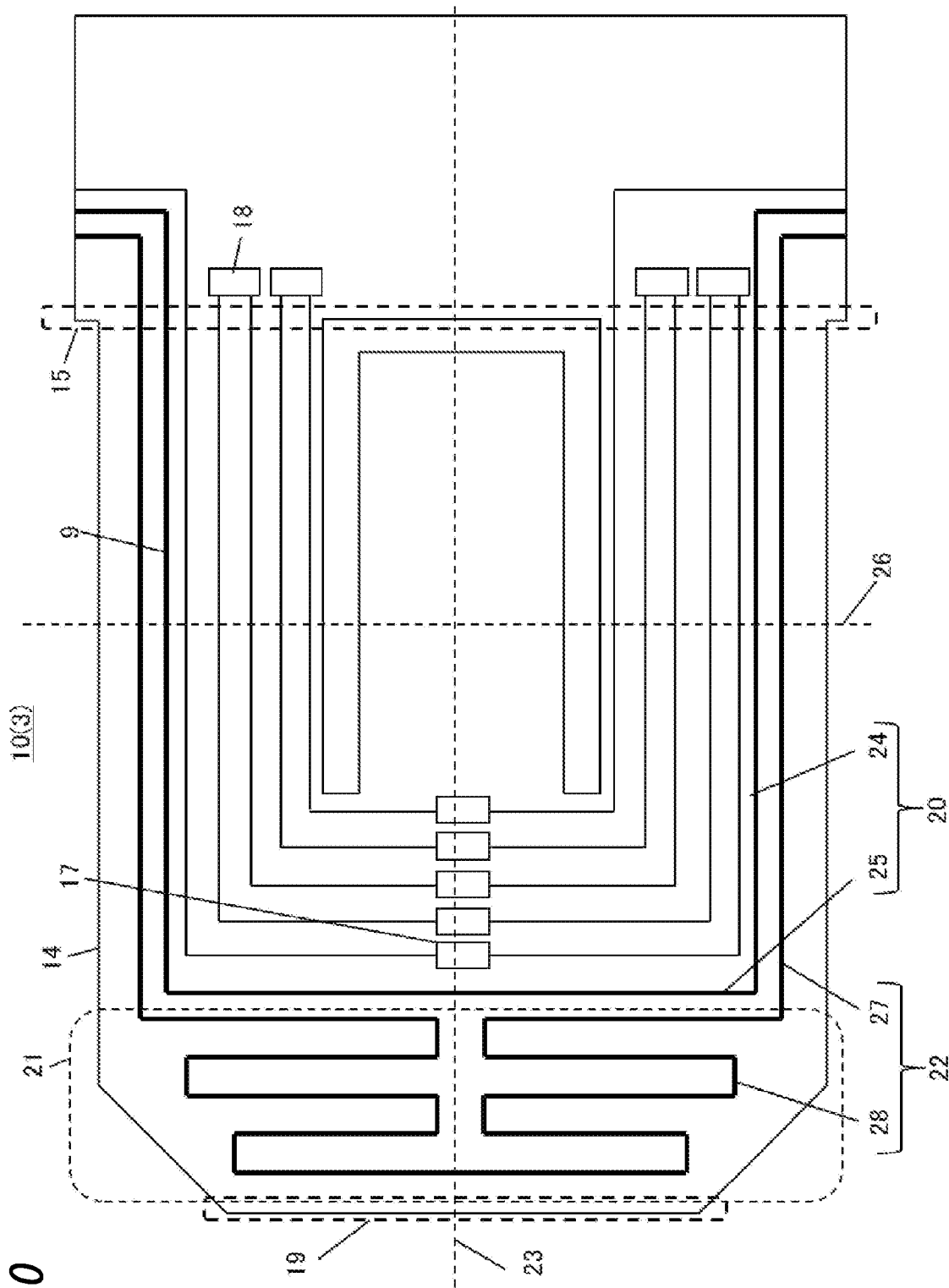
FIG. 10 is a view illustrating a variation of wiring of the breakage detection wiring of the infrared sensor.

Note that in the first embodiment, the breakage detection wiring 20 is wired such that the second wiring section 25 straddles the thermopile wirings 9, but this embodiment should not be construed as limiting. For example, as illustrated in FIG. 9, the second wiring section 25 may be wired to be located inside the bridge section 14 with respect to the thermopile wirings 9. Also when the second wiring section 25 is wired as described above, the breakage of the bridge section 14 can be accurately detected. Alternatively, depending on an application of the infrared sensor 1, as illustrated in FIG. 10, the second wiring section 25 may be wired to be located outside the thermopile wiring 9.

Second Embodiment

An infrared sensor chip of a second embodiment will be described with reference to the drawings.

Figure 11:
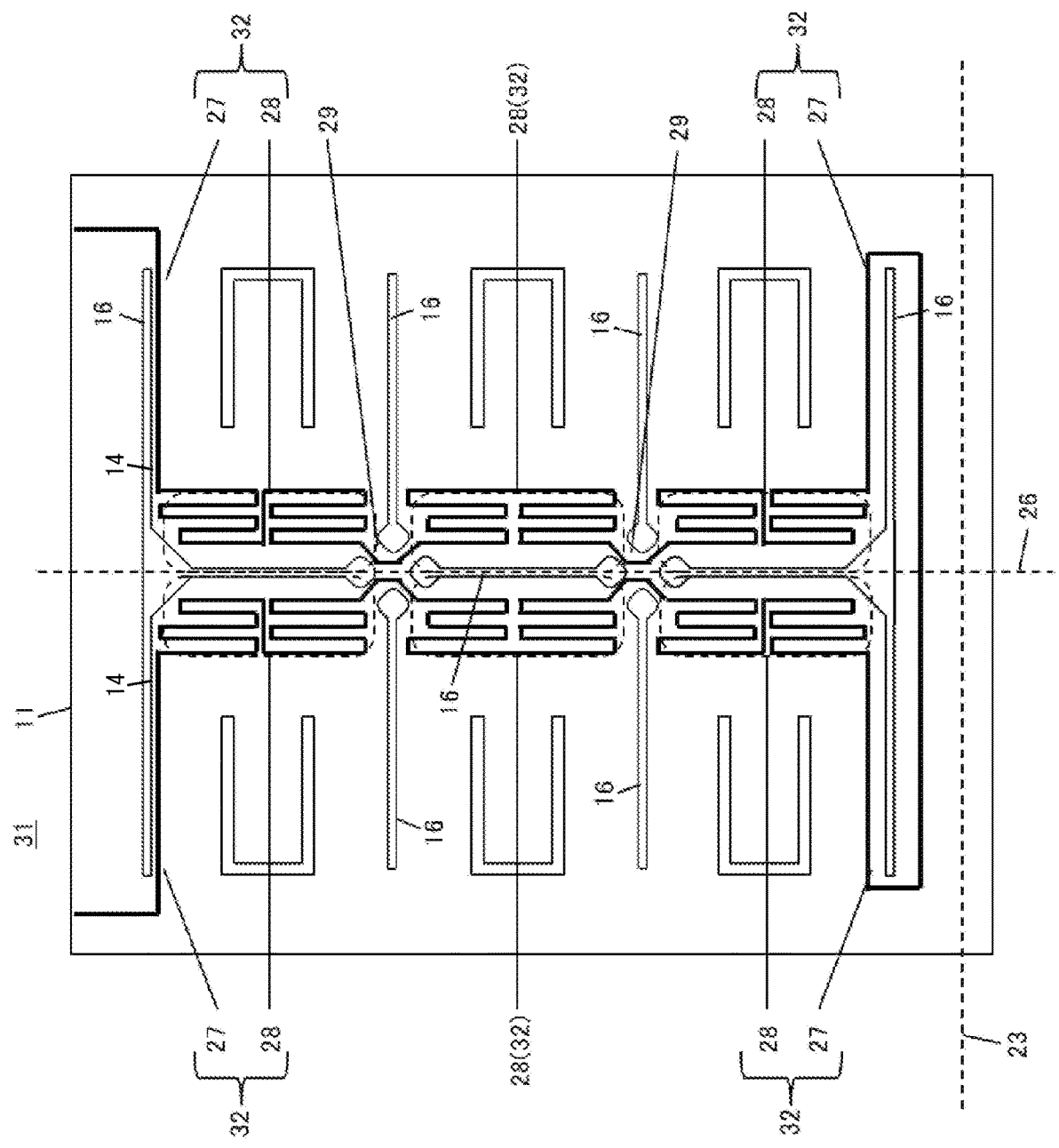
FIG. 11 is a view illustrating wiring of a heater wiring of an infrared sensor chip of a second embodiment.

FIG. 11 shows wiring of heater wirings 32 of an infrared sensor chip 31 in a pixel section 11 according to the second embodiment.

The infrared sensor chip 31 of the second embodiment includes a plurality of pixel sections 11 arranged in an array. Each pixel section 11 has a supporting substrate 13 having a cavity 12, a thin film structure section 10 supported by the supporting substrate 13, and bridge sections 14 included in the thin film structure section 10. In each bridge sections 14, a thermopile wiring 9, a breakage detection wiring 20, and a heater wiring 32 are provided, so that self-diagnosis of the infrared sensor 1 is possible. Note that although not shown in FIG. 11, the breakage detection wiring 20 is wired to be in the same shape as that in the infrared sensor chip 3 in the first embodiment.

In the infrared sensor chip 31 of the second embodiment, the heater wiring 32 is wired on a joint piece 29 and is connected to a heater wiring 32 of an adjacent bridge section 14. Wiring the heater wirings 32 as described above enables heater sections 28 of the bridge sections 14 to be connected with the shortest distance therebetween, thereby improving the heat generation efficiency. Thus, the 2-terminal connection enables the heater sections 28 to be efficiency heated.

In the infrared sensor 1, the heat generation efficiency at the heater sections 28 is improved, which enables self-diagnosis of the infrared sensor chip 31 to be more efficiently performed.

Third Embodiment

An infrared sensor chip including a diode in the vicinity of the infrared sensor chip has been known (WO 2002/075262).

Moreover, an infrared sensor including a substrate, an infrared sensor chip disposed on the substrate, and a package covering the infrared sensor chip has been known (WO 2011/162346).

In the infrared sensor chip disclosed in WO 2002/075262, however, diodes enclose the entire periphery of the infrared sensor chip, and therefore, the size of the infrared sensor increases. The infrared sensor disclosed in WO 2011/162346 includes a thermistor, and therefore, the size of the infrared sensor increases.

It is an object of the present disclosure to provide an infrared sensor which solves the problems and which is configured to measure a temperature of the infrared sensor chip without increasing the size of the infrared sensor.

An infrared sensor chip and an infrared sensor in a third embodiment will be described below with reference to the drawings.

Figure 12:
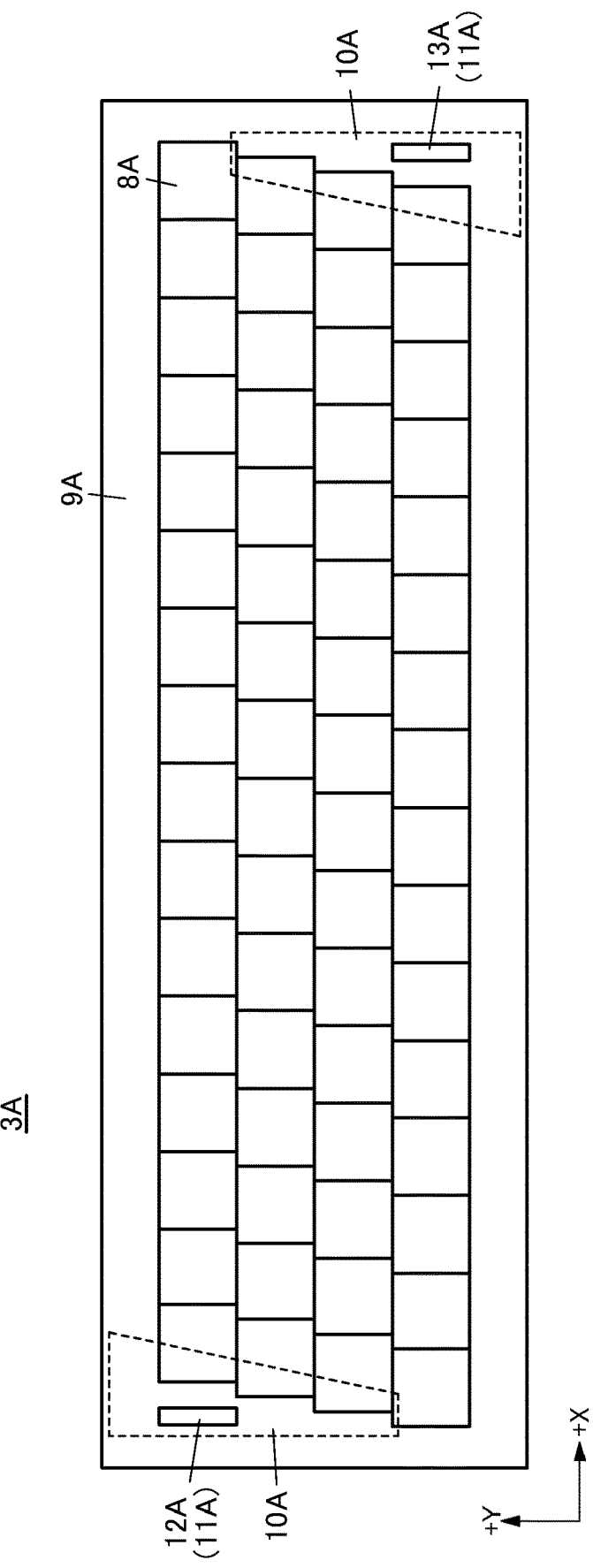
FIG. 12 is a top view illustrating an infrared sensor chip of a third embodiment.
Figure 13:
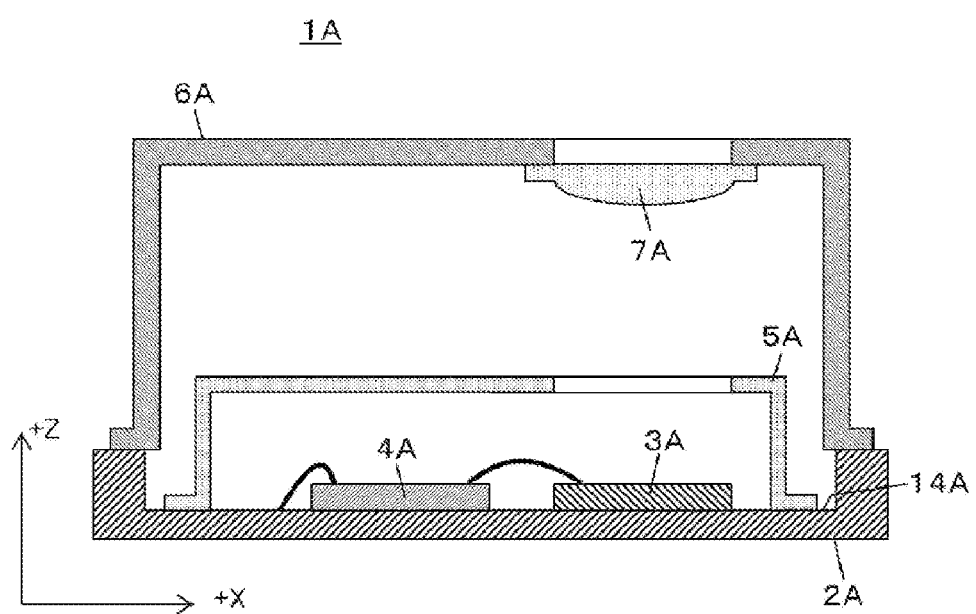
FIG. 13 is a side sectional view illustrating an infrared sensor of the infrared sensor chip of the third embodiment.

FIG. 12 is a top view illustrating the infrared sensor chip of the third embodiment. FIG. 13 is a side sectional view illustrating the infrared sensor of the infrared sensor chip of the third embodiment.

As illustrated in FIG. 13, an infrared sensor 1A includes a base 2A, an infrared sensor chip 3A having an array and provided on the base 2A, a process circuit element 4A provided on the base 2A, a cap 5A provided on the base 2A, and a package 6A provided on the base 2A to cover the infrared sensor chip 3A and the process circuit element 4A. In the following description, a row direction of the infrared sensor chip 3A is referred to as an X-axis direction, a column direction of the infrared sensor chip 3A is referred to as a Y-axis direction, and a direction orthogonal to the X axis and the Y axis is referred to as a Z-axis direction. Moreover, for convenience of explanation, the + side in the Z-axis direction is the front, and the − side in the Z-axis direction is the back, but this should not be construed as limiting.

The base 2A is formed of a substrate made of, for example, silicon. On the base 2A, a pads (not shown) for electrical connection are provided. The base 2A has one surface on which the infrared sensor chip 3A and the process circuit element 4A are aligned in the X-axis direction. The infrared sensor chip 3A is electrically connected to the process circuit element 4A via the pads and bonding wires provided on the base 2A.

The package 6A is formed of a metal material such as iron or SUS and includes a layer plated with nickel. The package 6A has a through hole in front of the infrared sensor chip 3A. A lens 7A is disposed to cover the through hole. The space in the package 6A has a dry atmosphere filled with nitrogen. The atmosphere in the space covered with the package 6A is not limited to this embodiment but may be, for example, a vacuum atmosphere. When the space covered with the package 6A has the vacuum atmosphere, a getter on which remaining gas and the like is adsorbed is at least disposed in the space. As a material for the getter, a non-evaporation getter made of, for example, a zirconium alloy and/or a titanium alloy is at least adopted.

The lens 7A adopts an aspherical surface lens made of a semiconductor material. Adopting the aspherical surface lens as the lens 7A enables the focal length and the aberration of the lens 7A to be reduced even with a large diameter of the aperture in the lens 7A. Thus, reducing the focal length of the lens 7A realizes a reduction of the thickness of the package 6A.

The cap 5A is formed of a material such as iron or SUS and includes a layer plated with nickel. The cap 5A has a through hole in front of the infrared sensor chip 3A. The cap 5A surrounds lateral sides of the infrared sensor chip 3A and the process circuit element 4A to be able to reduce the influence of an interference noise over the infrared sensor chip 3A.

The circuit configuration of the process circuit element 4A is at least accordingly designed depending on the type or the like of the infrared sensor chip 3A and may be a circuit configuration including, for example, a control circuit for controlling the infrared sensor 1A, an amplifier circuit for amplifying an output voltage of the infrared sensor chip 3A, and a multiplexer for selectively inputting, into the amplifier circuit, one of output voltages output from the infrared sensor chip 3A to a plurality of pads.

The infrared sensor chip 3A has a thermal infrared detector. In the thermal infrared detector, a temperature sensor is embedded. The temperature sensor is a thermoelectric converter. The thermoelectric converter includes thermopiles. Each thermopile converts thermal energy generated from infrared radiation into electrical energy. The infrared radiation is output from an object serving as a measurement target. The infrared sensor 1A further includes a×b (each of a and b is a natural number) pixel sections 8A (non-contact infrared radiation sensing elements) on one surface of the semiconductor substrate 9A. The pixels sections 8A are arranged in a two-dimensional array including "a" rows and "b" columns. Each pixel section 8A includes a temperature sensor and a MOS transistor for extracting an output voltage of the temperature sensor. Note that the number of pixel sections 8A is at least determined to satisfy relationships a≥2 and b≥2. The pixel sections 8A in the third embodiment are arranged in a 16×4-array. Note that the pixel sections 8A do not necessarily have to be arranged in the 16×4 array but may be arranged in, for example, an 8×8 array.

As illustrated in FIG. 12, in the infrared sensor chip 3A, the pixel sections 8A in each two adjacent rows shifted from each other in the row direction such that ends of the infrared sensor chip 3A in the row direction have steps. In two spaces 10A formed by shifting the pixel sections 8A from each other, temperature sensors 11A are provided. As each temperature sensor 11A, a diode is adopted. Adopting the diode as each temperature sensor 11A enables each temperature sensor 11A to be formed in a simple step. The temperature sensors 11A are a first temperature sensor 12A and a second temperature sensor 13A. The first temperature sensor 12A and the second temperature sensor 13A are provided in the spaces 10A. Thus, it is possible to measure the temperature of the infrared sensor chip 3A without increasing the size of the infrared sensor chip 3A. Since the two spaces 10A are formed by shifting the pixel sections 8A, which are adjacent to each other in the column direction, from each other in the row direction, the two spaces 10 are point symmetric about the center of the pixel sections 8A. Therefore, the first temperature sensor 12A and the second temperature sensor 13A are provided at point-symmetric locations about the center of the pixel sections 8A. Since the process circuit element 4A is located in the X-axis direction of the infrared sensor chip 3A, the infrared sensor chip 3A is heated from a location close to the process circuit element 4A (the − side in the X-axis direction), and a location away from the process circuit element 4A (the + side in the X-axis direction) is heated later. Thus, during a period from a start of driving of the infrared sensor 1A until the temperature of the infrared sensor chip 3A reaches a stationary state, temperature non-uniformity occurs in the infrared sensor chips 3A. However, arranging the first temperature sensor 12A and the second temperature sensor 13A at the point-symmetric locations enables detection of the temperature of the entirety of the infrared sensor chip 3A, and thereby, it is possible to reduce the influence of the temperature non-uniformity over the infrared sensor 1A. The first temperature sensor 12A and the second temperature sensor 13A extend parallel to each other in the column direction. Thus, efficient disposition in the space 10A is possible, and thus, downsizing of the infrared sensor chip 3A is possible. Note that depending on the shape and the arrangement in the infrared sensor chip 3A and/or the arrangement of the pixel sections 8A, the temperature sensors 11A may be disposed to be parallel to each other in the row direction as long as the infrared sensor chip 3A can be downsized.

Note that the description has been given with reference to the infrared sensor chip 3A in which the pixel sections 8A adjacent to each other in the column direction are shifted from each other in the row direction, but an infrared sensor chip 3A may be adopted in which pixel sections 8A are not shifted from each other and a collection of all the pixel sections 8A has a rectangular outer shape. In this case, the first temperature sensor 12A and the second temperature sensor 13A are not disposed in the spaces 10A, but the first temperature sensor 12A is disposed in the vicinity of the − side end in the X-axis direction of the pixel sections 8A, and the second temperature sensor 13A is disposed in the vicinity of the + side end in the X-axis direction of the pixel sections 8A. Also when such a configuration is adopted, it is possible to detect a temperature of the infrared sensor chip 3A, the temperature being started to be increased due to the influence of the temperature of the process circuit element 4A.

Next, a method for fabricating the infrared sensor chip 3A will be described.

FIGS. 14A to 14F show a method for fabricating an infrared sensor chip of the present embodiment.

Figure 14A:
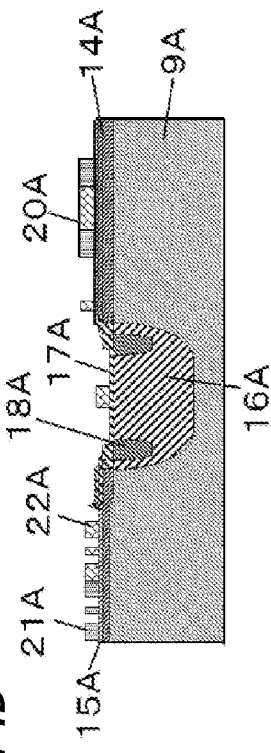
FIGS. 14A to 14F are views illustrating a method for fabricating the infrared sensor chip of the third embodiment.

First of all, as illustrated in FIG. 14A, the semiconductor substrate 9A is prepared, and the semiconductor substrate 9A is subjected to a thermal oxidation process to form a thermal oxide film 14A on the semiconductor substrate 9A, and a SiN film 15A (silicon nitride film) is then formed on the thermal oxide film 14A. The SiN film 15A is removed from an area in which a MOS transistor is to be formed in the semiconductor substrate 9A. P-type impurities are injected to form a p-well 16A. Above the semiconductor substrate 9A, a mask 17A is formed, and ions for formation of a channel stopper are injected into the p-well 16A, thereby forming a channel stopper 18A in the p-well 16A. Above the semiconductor substrate 9A, a mask 17A is formed, and ion injection is performed to adjust a threshold voltage.

Figure 14B:
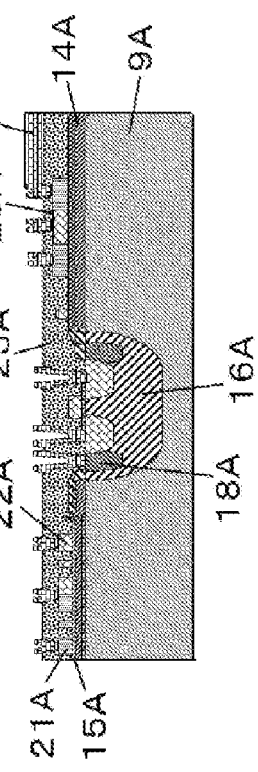

Next, as illustrated in FIG. 14B, gate oxidation is performed to form a poly-Si film 19A for gate/for thermopiles.

Figure 14C:
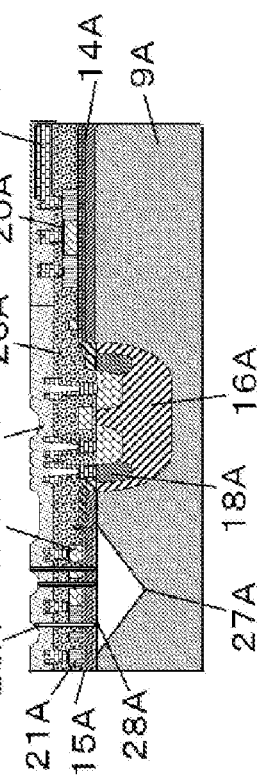
Figure 14D:
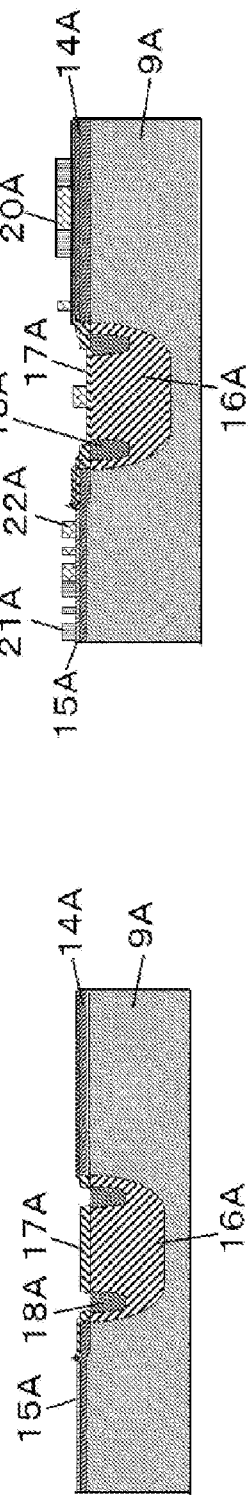

Then, as illustrated in FIG. 14C, p-type impurities are injected to form a p-type thermopile element 21A.

Next, as illustrated in FIG. 14 D, n-type impurities are injected to form a diode 20A and an n-type thermopile element 22A.

Figure 14E:
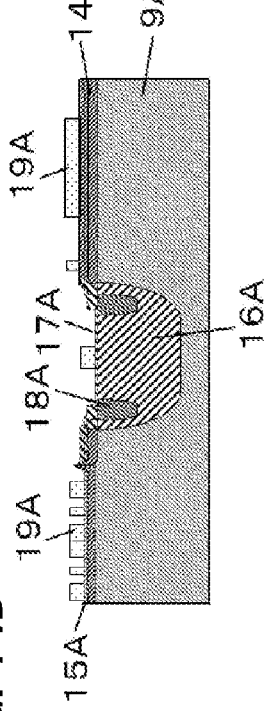

Then, as illustrated in FIG. 14E, an interlayer insulation film 23A made of boron phosphorus silicon glass (BPSG) is formed above the semiconductor substrate 9A. The interlayer insulation film 23A is etched to form a contact window. On the interlayer insulation film 23A, a wire 24A made of Al is formed.

Figure 14F:
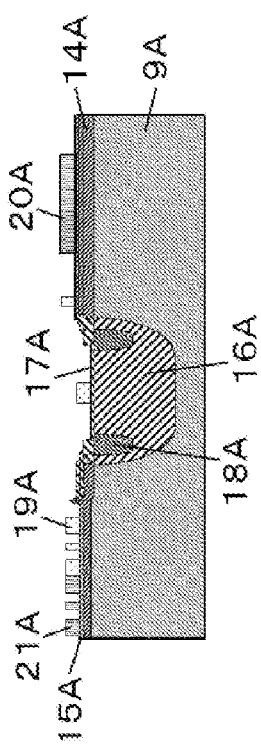

Next, as illustrated in FIG. 14F, on the interlayer insulation film 23A, a passivation film 25A made of BPSG is formed, and a bridge opening 26A is formed by etching. At a lower portion of the bridge opening 26A, a cavity 27A is formed by etching, thereby forming a bridge 28A. The infrared sensor chip 3A is thus completed.

Forming the infrared sensor chip 3A as described above enables the temperature sensor 11A to be formed on the infrared sensor chip 3A in the same step as that of the pixel sections 8A, and thus, it is possible to form the temperature sensor 11A in a simple step. Thus, productivity is increased. Moreover, the temperature sensor 11A and the infrared sensor chip 3A are formed in the same step, and thus, the temperature sensor 11A and the infrared sensor chip 3A have the same concentration.

Note that the diode 20A is formed as the temperature sensor 11A, but in addition to the poly-Si film 19A, for example, a resistor 29A may be formed, and the diode 20A and the resistor 29A may be connected in series to each other and may be used as the temperature sensor 11A (see FIGS. 15A to 15F).

Figure 15A:
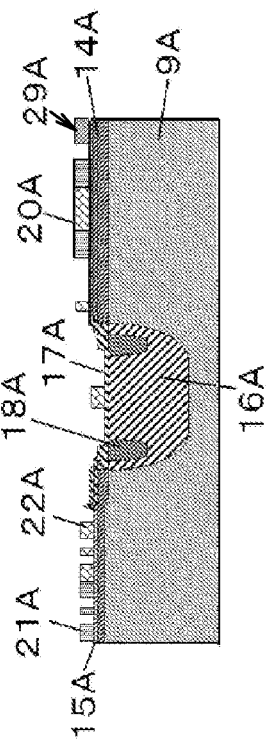
FIGS. 15A to 15F are views illustrating another method for fabricating the infrared sensor chip of the third embodiment.

As illustrated in FIG. 15A, a semiconductor substrate 9A is prepared, and the semiconductor substrate 9A is subjected to a thermal oxidation process to form a thermal oxide film 14A on the semiconductor substrate 9A, and a SiN film 15A (silicon nitride film) is then formed on the thermal oxide film 14A. The SiN film 15A is removed from an area in which a MOS transistor is to be formed in the semiconductor substrate 9A. P-type impurities are injected to form a p-well 16A. Above the semiconductor substrate 9A, a mask 17A is formed, and ions for formation of a channel stopper are injected into the p-well 16A, thereby forming a channel stopper 18A in the p-well 16A. Above the semiconductor substrate 9A, a mask 17A is formed, and ion injection is performed to adjust a threshold voltage.

Figure 15B:
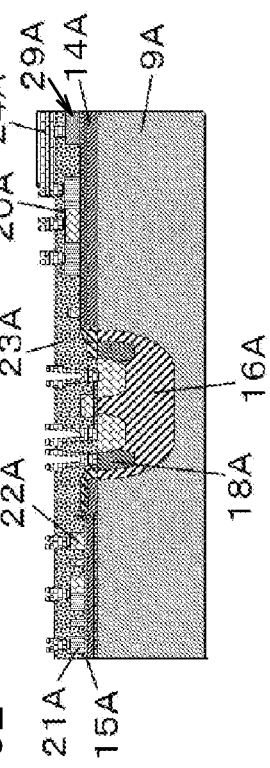

Next, as illustrated in FIG. 15B, gate oxidation is performed and then, a poly-Si film 19A for gate/for thermopiles and resistors is formed.

Figure 15C:
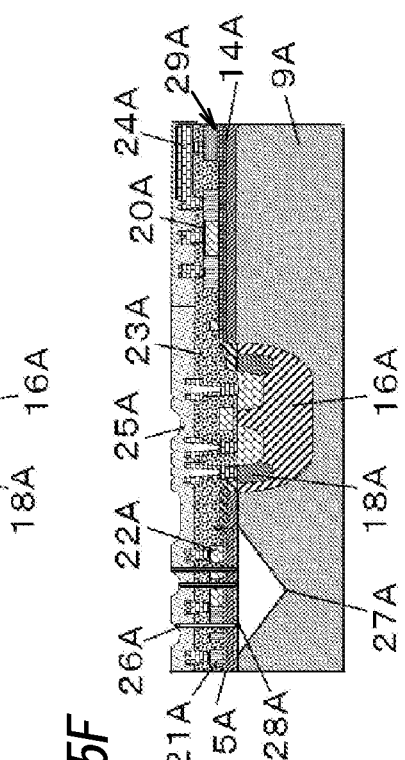

Then, as illustrated in FIG. 15C, p-type impurities are injected to form a p-type thermopile element 21A. Moreover, p-type impurities are accordingly injected to form a resistor 29A. Note that the injection of the p-type impurities for forming the resistor 29A is not essential.

Figure 15D:
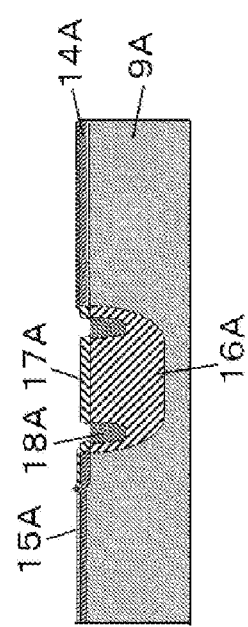

Next, as illustrated in FIG. 15D, n-type impurities are injected to form a diode 20A and an n-type thermopile element 22A.

Figure 15E:
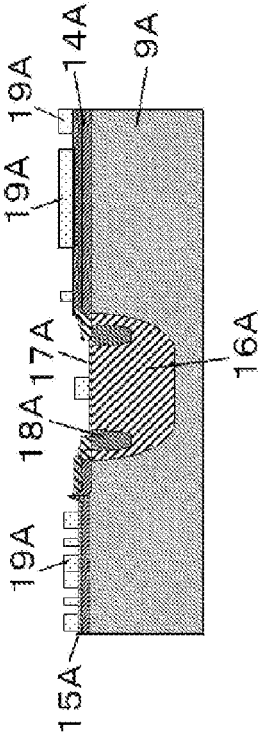

Then, as illustrated in FIG. 15E, an interlayer insulation film 23A made of boron phosphorus silicon glass (BPSG) is formed above the semiconductor substrate 9A. The interlayer insulation film 23A is etched to form a contact window. On the interlayer insulation film 23A, a wire 24A made of Al is formed. The diode 20A and the resistor 29A are connected to each other via the wire 24A.

Figure 15F:
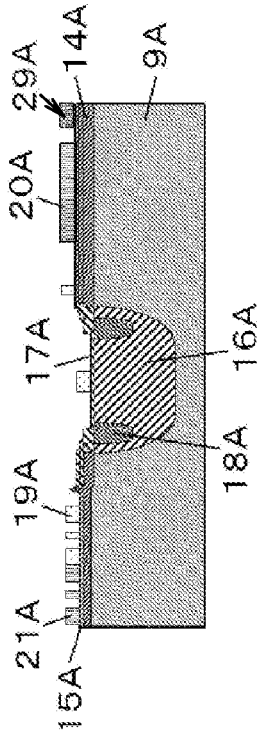

Next, as illustrated in FIG. 15F, on the interlayer insulation film 23A, a passivation film 25A made of BPSG is formed, and a bridge opening 26A is formed by etching. At a lower portion of the bridge opening 26A, a cavity 27A is formed by etching, thereby forming a bridge 28A. The infrared sensor chip 3A is thus completed.

As described above, also when the diode 20A and the resistor 29A are used as temperature sensors 11A, it is possible to accurately detect the temperature of the infrared sensor chip 3A.

Fourth Embodiment

An infrared sensor chip and an infrared sensor of a fourth embodiment will be described with reference to the drawings.

Figure 17:
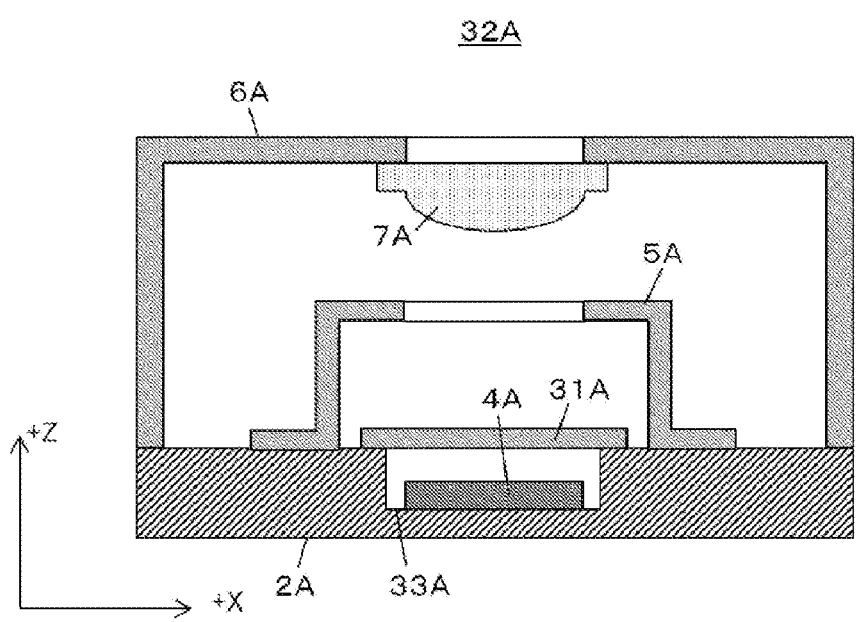
FIG. 17 is a side sectional view illustrating an infrared sensor employing the infrared sensor chip of the fourth embodiment.

FIG. 16 is a top view illustrating the infrared sensor chip of the fourth embodiment. FIG. 17 is a side sectional view illustrating the infrared sensor of the fourth embodiment employing the infrared sensor chip.

An infrared sensor chip 31A of the fourth embodiment includes a first temperature sensor 12A and a second temperature sensor 13A. The first temperature sensor 12A is disposed in a space formed by shifting pixel sections 8A. The second temperature sensor 13A is disposed in a central portion in the Y-axis direction parallel to the row direction.

As illustrated in FIG. 17, an infrared sensor 32A includes the infrared sensor chip 31A disposed on a base 2A, a process circuit element 4A, a cap 5A provided on the base 2A, and a package 6A covering the infrared sensor chip 31A and the process circuit element 4A. The base 2A has a recess 33A, and the process circuit element 4A is disposed in the recess 33A. The infrared sensor chip 31A covers the recess 33A. The infrared sensor chip 31A has both ends in the X-axis direction, and the both ends are connected to the base 2A. The infrared sensor chip 31A has a central part which is suspended in the air. The process circuit element 4A is located rearward of the infrared sensor chip 31A. However, since the infrared sensor chip 31A is suspended in the air, heat generated from the process circuit element 4A is transmitted via the base 2A from connection parts of the infrared sensor chip 31A and the base 2A to the infrared sensor chip 31A. Thus, according to the structure of the infrared sensor 32A, the temperature of the infrared sensor chip 31A starts increasing from the both ends of the infrared sensor chip 31A, thereby causing temperature non-uniformity in the infrared sensor chip 31A. In the infrared sensor chip 31A, the first temperature sensor 12A is disposed in a space 10A at one end of the both ends in the X-axis direction, and the second temperature sensor 13A is disposed in the central part. Thus, it is possible to detect both the temperature at the end in the X-axis direction and the temperature at the central part of the infrared sensor chip 31A. The temperature at the end in the X-axis direction first increases due to the process circuit element 4A, and then, the temperature at the central part increases. Therefore, it is possible to reduce the influence of the temperature non-uniformity over the infrared sensor chip 31A. Note that in FIG. 16, the first temperature sensor 12A is provided at the end on the − side in the X-axis direction of the infrared sensor chip 31A but may be provided at an end on the + side in the X-axis direction. Moreover, the second temperature sensor 13A is provided on the − side in the Y-axis direction of the infrared sensor chip 31A but may be provided on the + side in the Y-axis direction.

Fifth Embodiment

An infrared sensor chip and an infrared sensor of a fifth embodiment will be described with reference to the drawings.

Figure 18:
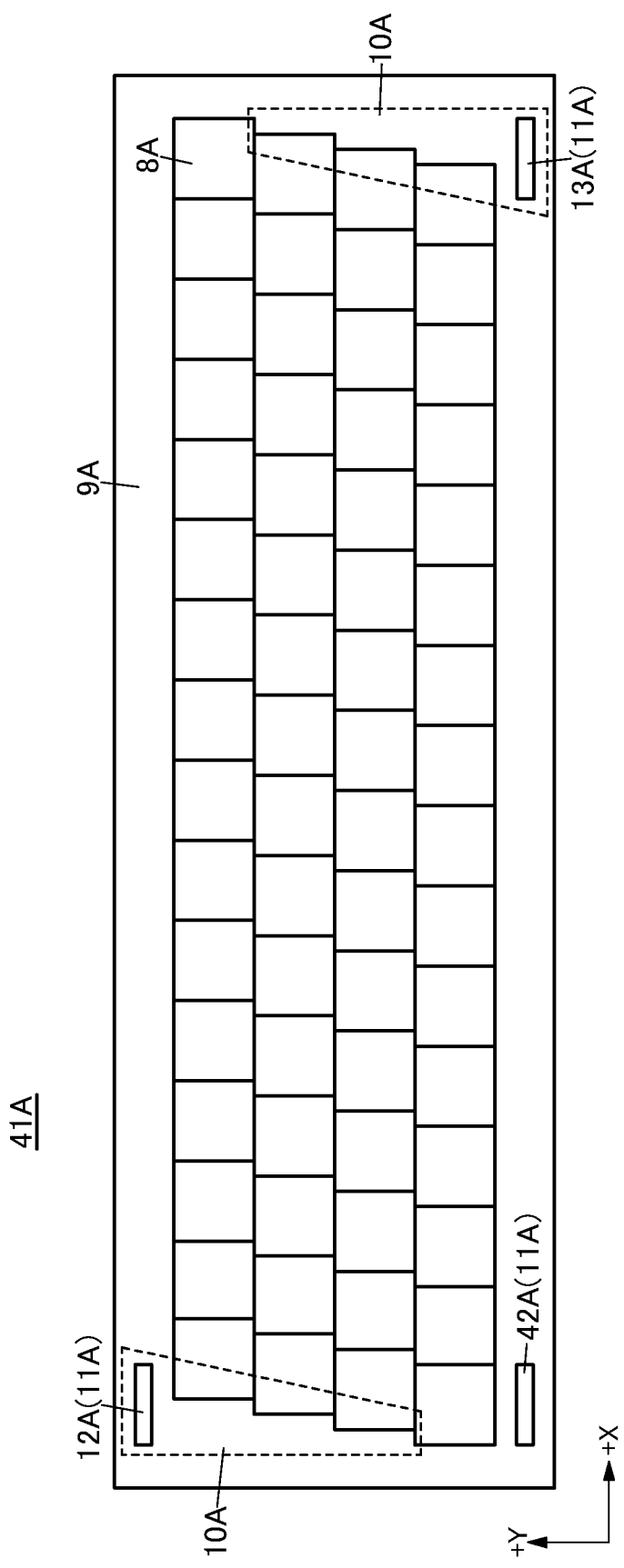
FIG. 18 is a top view illustrating an infrared sensor chip of a fifth embodiment.

FIG. 18 is a top view illustrating the infrared sensor chip of the fifth embodiment.

An infrared sensor chip 41A of the fifth embodiment includes a first temperature sensor 12A, a second temperature sensor 13A, and a third temperature sensor 42A. The first temperature sensor 12A and the second temperature sensor 13A are arranged in spaces 10A at corners of an array of pixel sections 8A in a point-symmetric relationship about the center of the arrays of the pixel sections 8A. The third temperature sensor 42A is disposed at a location which is different from the locations of the first temperature sensor 12A and the second temperature sensor 13A and which is in the vicinity of a corner of the array of the pixel sections 8A. In FIG. 18, the third temperature sensor 42A is disposed on the − side in the X-axis direction of the pixel sections 8A and in the vicinity of a corner on the − side in the Y-axis direction. The third temperature sensor 42A is disposed in a location close to a process circuit element 4A. As described above, two temperature sensors 11A are disposed at locations close to a heat source, and therefore, it is possible to more accurately detect the temperature of the infrared sensor chip 41A.

Figure 19:
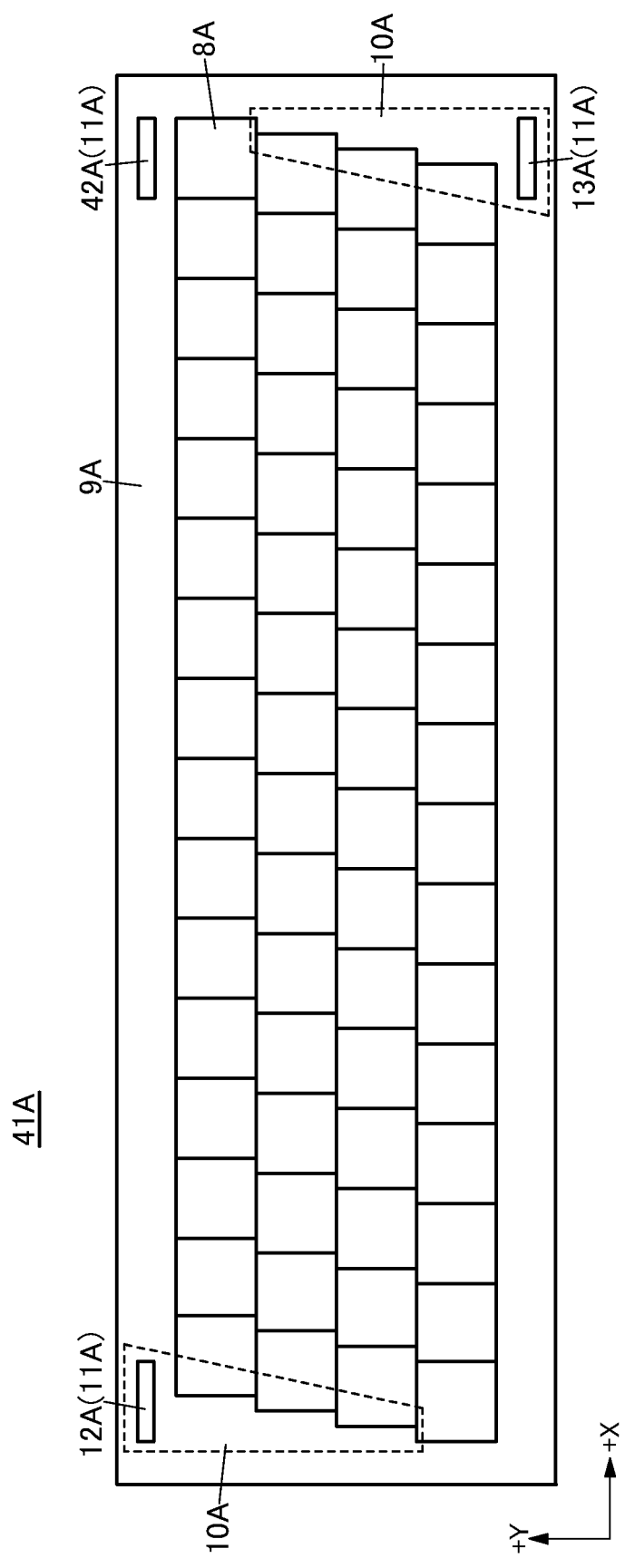
FIG. 19 is a top view illustrating a variation of the infrared sensor chip of the fifth embodiment.

Note that in the infrared sensor, the third temperature sensor 42A is disposed in the vicinity of the corner of the array of the pixel sections 8A at a location close to the process circuit element 4A but may be disposed in the vicinity of a corner of the array of the pixel sections 8A at a location away from the process circuit element 4A. In FIG. 19, the third temperature sensor 42A is disposed on the + side in the X-axis direction of the pixel sections 8A and in the vicinity of a corner on the + side in the Y-axis direction. FIG. 19 is a top view illustrating a variation of the infrared sensor chip 41A of the fifth embodiment. Also in this arrangement, it is possible to more accurately detect the temperature of the infrared sensor chip 41A than in a case where the two temperature sensors 11A are arranged.

Sixth Embodiment

An infrared sensor chip and an infrared sensor of a sixth embodiment will be described with reference to the drawings.

Figure 20:
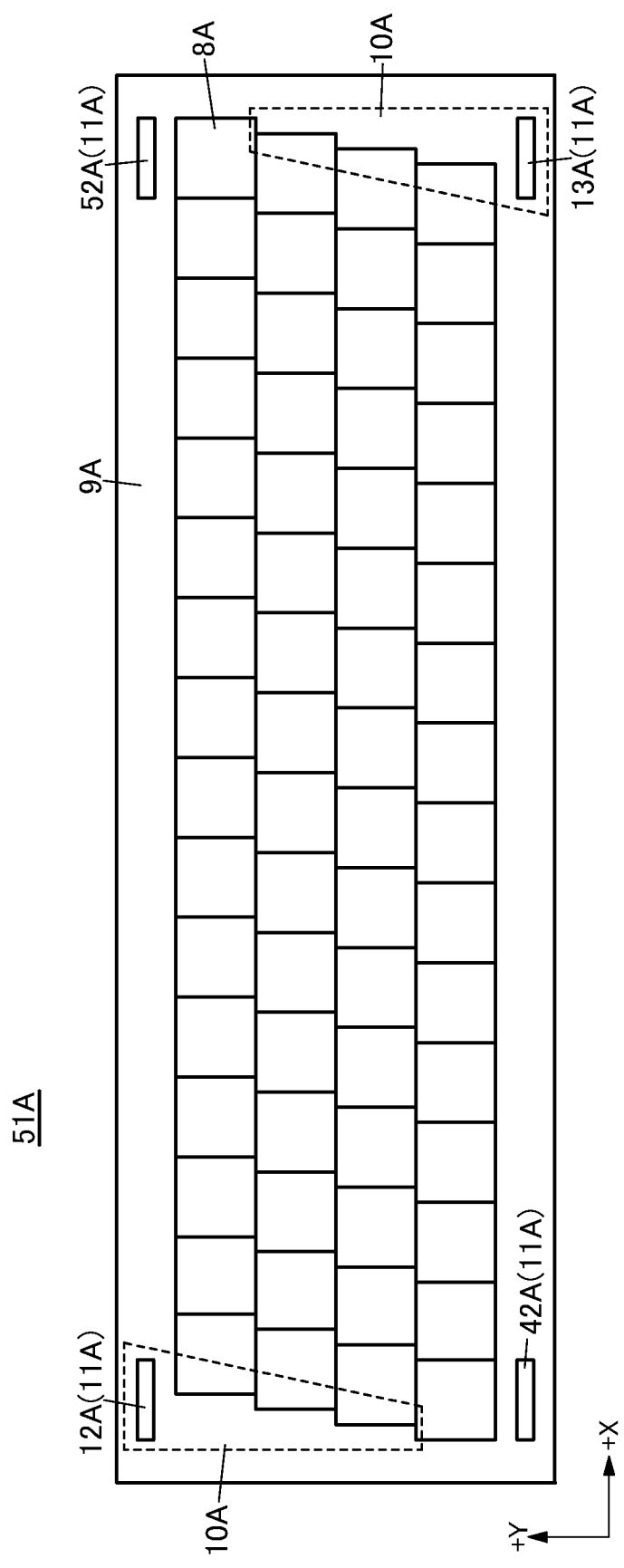
FIG. 20 is a top view illustrating an infrared sensor chip of a sixth embodiment.

FIG. 20 is a top view illustrating the infrared sensor chip of the sixth embodiment.

An infrared sensor chip 51A of the sixth embodiment includes a first temperature sensor 12A, a second temperature sensor 13A, a third temperature sensor 42A, and a fourth temperature sensor 52A. The first temperature sensor 12A and the second temperature sensor 13A are disposed in spaces 10A at corners of an array of pixel sections 8A in a point-symmetric relationship about the center of the array of the pixel sections 8A. The third temperature sensor 42A and the fourth temperature sensor 52A are disposed in the vicinity of corners of the array of the pixel sections 8A, the corners being different from those where the first temperature sensor 12A and the second temperature sensor 13A are disposed. The third temperature sensor 42A and the fourth temperature sensor 52A are disposed to be point symmetric about the center of the pixel sections 8A. As described above, two temperature sensors 11A are disposed close to a process circuit element 4A, and two temperature sensors 11A are disposed away from the process circuit element 4A, and thereby, it is possible to more accurately detect the temperature of the infrared sensor chip 51A than the infrared sensor chip 51A of the fifth embodiment in which three temperature sensors 11A are provided.

Figure 21:
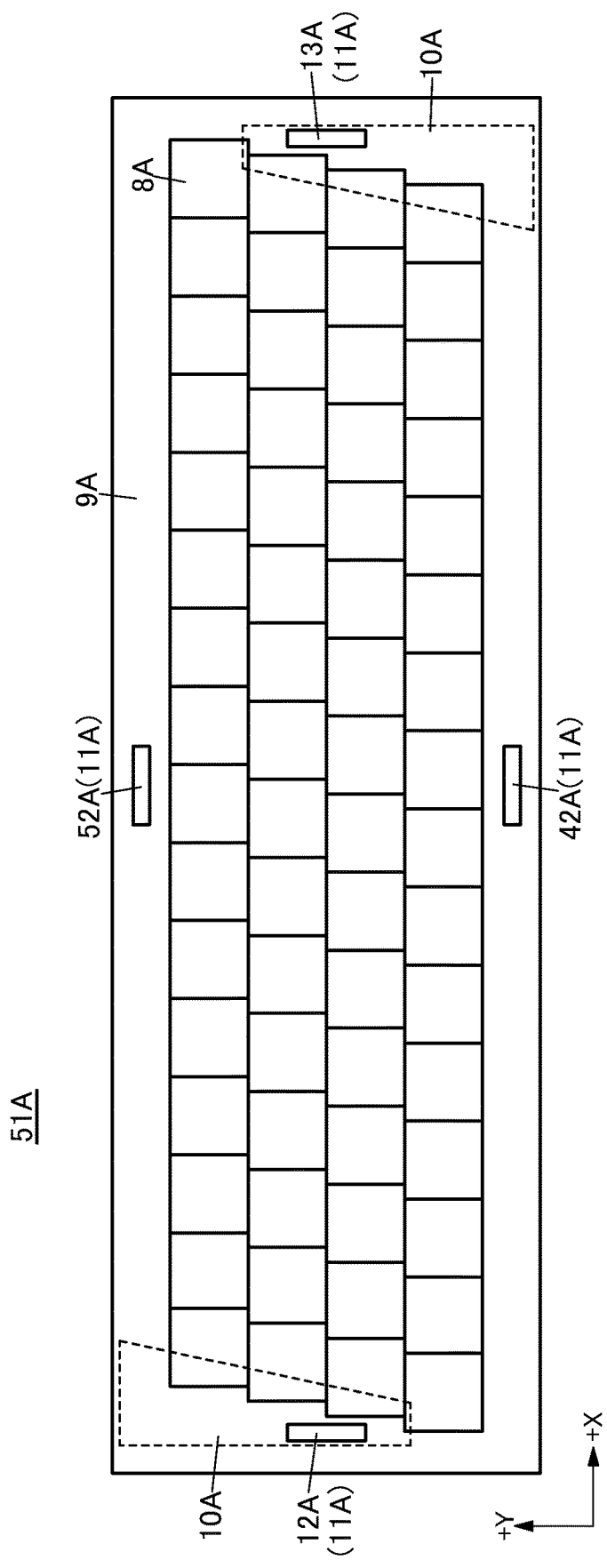
FIG. 21 is a top view illustrating a variation of the infrared sensor chip of the sixth embodiment.

Note that in the infrared sensor chip 51A, the first temperature sensor 12A, the second temperature sensor 13A, the third temperature sensor 42A, and the fourth temperature sensor 52A are disposed in the vicinity of the respective corners of the array of the pixel sections 8A, but this should not be construed as limiting. FIG. 21 is a top view illustrating a variation of the infrared sensor chip 51A of the sixth embodiment. The first temperature sensor 12A may be disposed in the vicinity of an end on the − side in the X-axis direction of the pixel sections 8A, the second temperature sensor 13A may be disposed in the vicinity of an end on the + side in the X-axis direction of the pixel sections 8A, the third temperature sensor 42A may be disposed in the vicinity of an end on the − side in the Y-axis direction of the pixel sections 8A, and the fourth temperature sensor 52A may be disposed in the vicinity of an end on the + side in the Y-axis direction of the pixel sections 8A. Also when temperature sensors 11A are arranged as described above, it is possible to more accurately detect the temperature of the infrared sensor chip 51A than in a case where the three temperature sensors 11A are arranged. Note that the third temperature sensor 42A and the fourth temperature sensor 52A may be disposed at locations shifted from each other in the X-axis direction. With this arrangement, it is possible to more accurately detect distribution of the temperature of the infrared sensor chip 51A. Moreover, the infrared sensor chip is particularly effective in a structure in which a base 2 has the recess 33A and the process circuit element 4A is disposed in the recess 33A, as in the case of the infrared sensor 32A shown in FIG. 17.

Seventh Embodiment

An infrared sensor chip and an infrared sensor of a seventh embodiment will be described with reference to the drawings.

Figure 22:
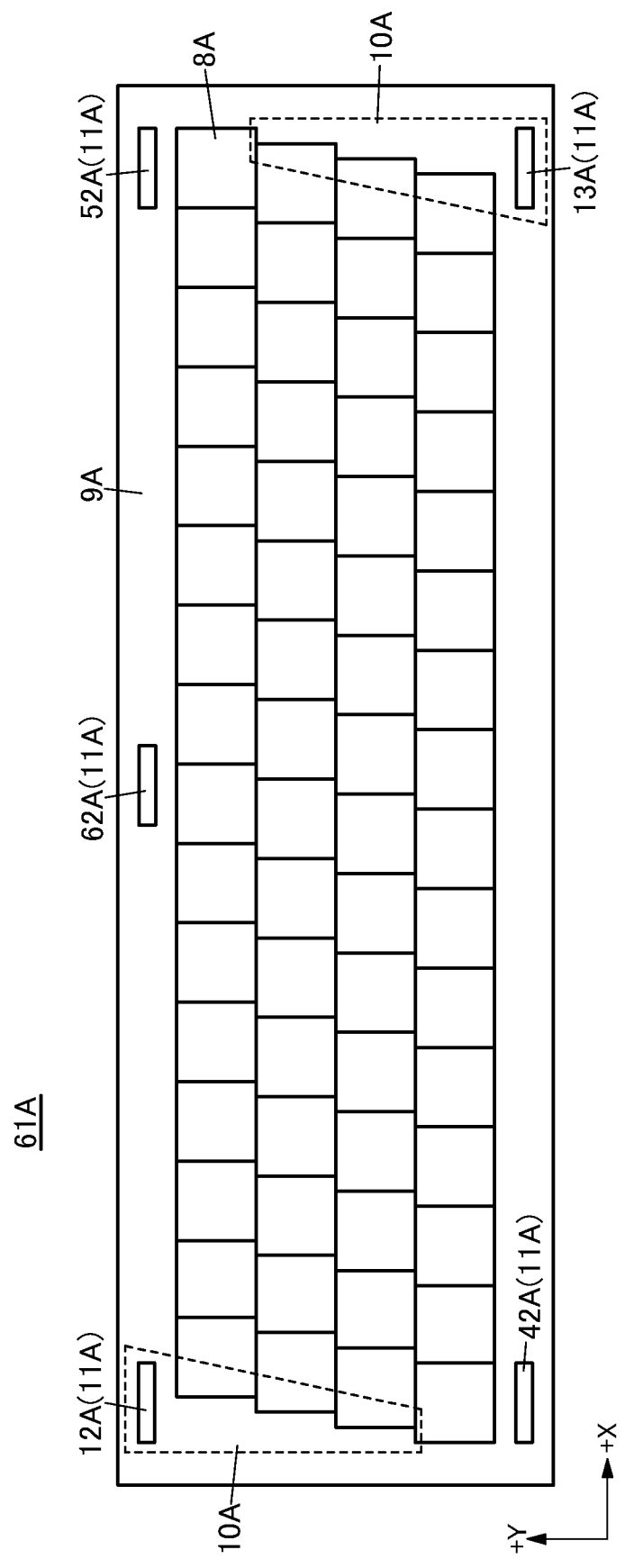
FIG. 22 is a top view illustrating an infrared sensor chip of a seventh embodiment.

FIG. 22 is a top view illustrating the infrared sensor chip of the seventh embodiment.

An infrared sensor chip 61A of the seventh embodiment includes a first temperature sensor 12A, a second temperature sensor 13A, a third temperature sensor 42A, a fourth temperature sensor 52A, and a fifth temperature sensor 62A. The first to fourth temperature sensors 12A, 13A, 42A and 52A are disposed in the vicinity of four corners of an array of pixel sections 8A. The fifth temperature sensor 62A is disposed on the + side in the Y-axis direction of the pixel sections 8A. With this arrangement, it is possible to more accurately detect the temperature of the infrared sensor chip 61A than in a case where four temperature sensors 11A are adopted.

Figure 23:
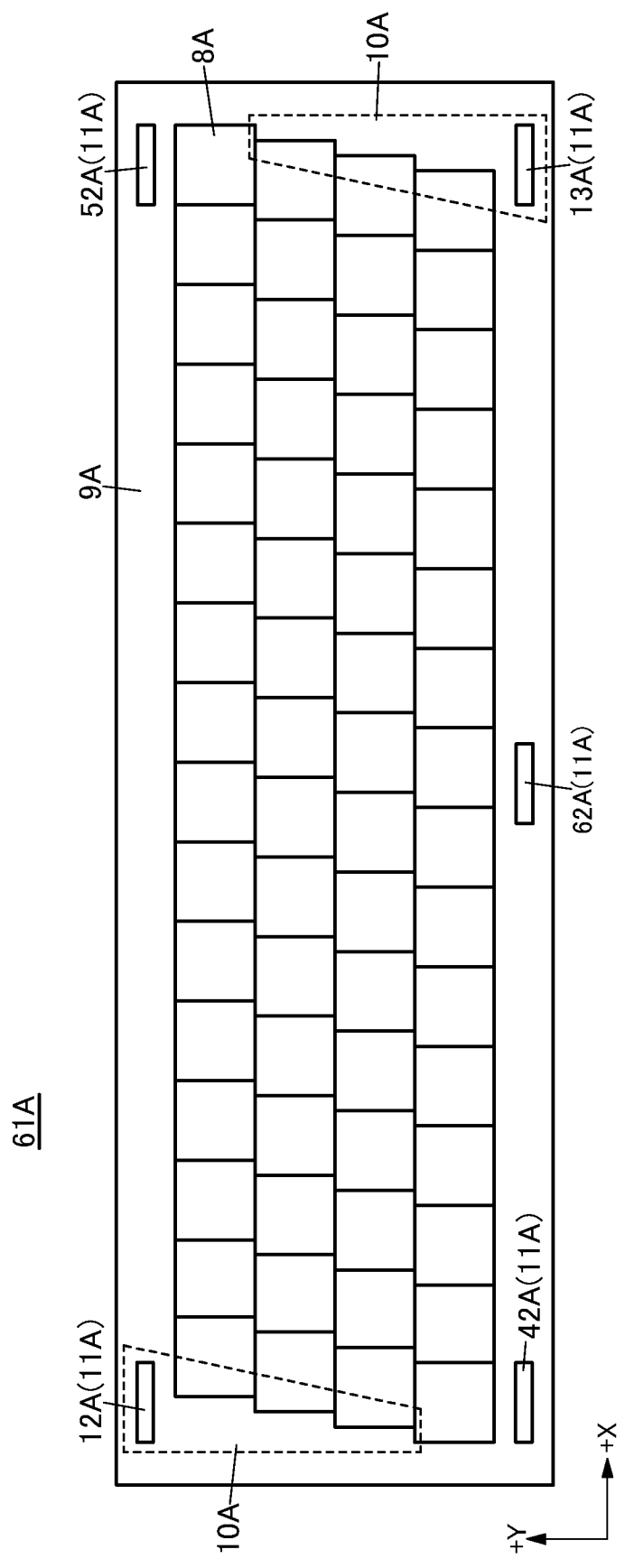
FIG. 23 is a top view illustrating a variation of the infrared sensor chip of the seventh embodiment.

Note that the temperature sensors 11A may be disposed on the − side in the Y-axis direction of the pixel sections 8A. FIG. 23 is a top view illustrating a variation of the infrared sensor chip 61A of the eighth embodiment. This arrangement also enables the temperature of the infrared sensor chip 61A to be accurately detected.

Eighth Embodiment

An infrared sensor chip and an infrared sensor of an eighth embodiment will be described with reference to the drawings.

Figure 24:
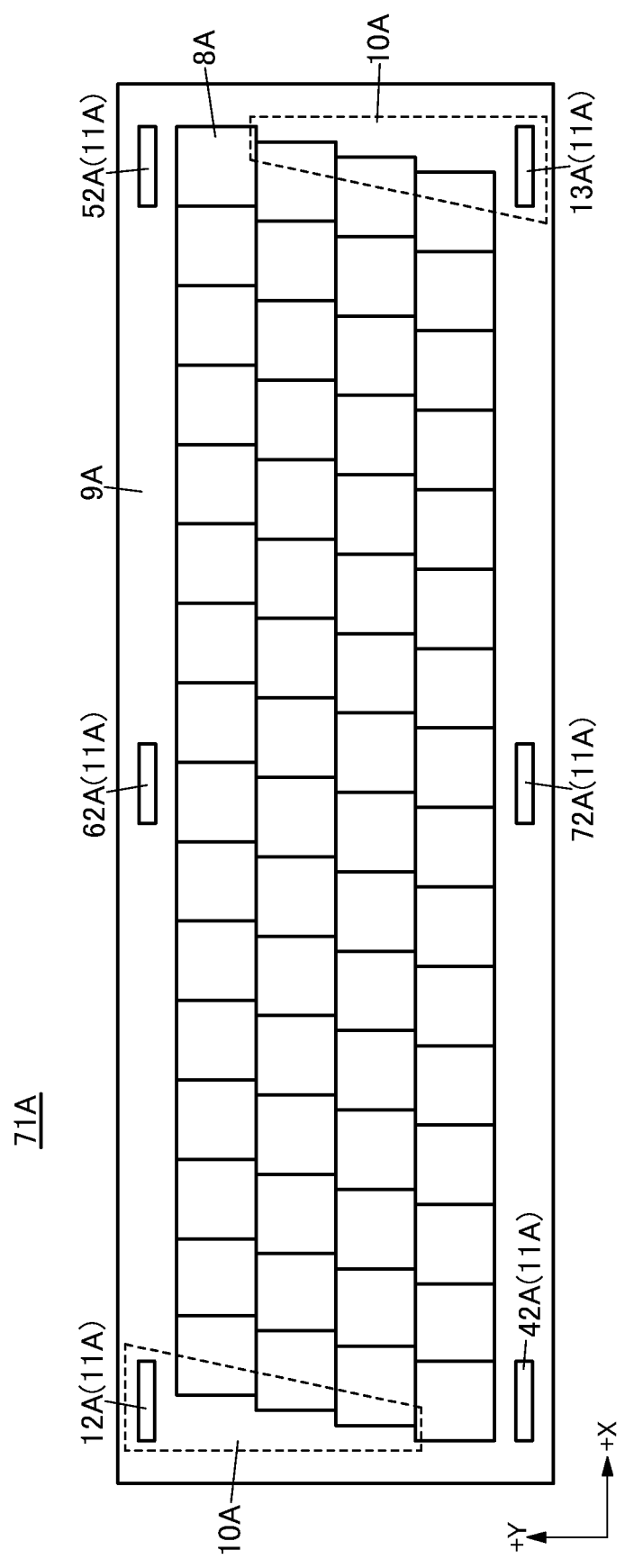
FIG. 24 is a top view illustrating an infrared sensor chip of an eighth embodiment.

FIG. 24 is a top view illustrating the infrared sensor chip of the eighth embodiment.

An infrared sensor chip 71A of the eighth embodiment includes a first temperature sensor 12A, a second temperature sensor 13A, a third temperature sensor 42A, and a fourth temperature sensor 52A which are disposed in the vicinity of four corners of an array of pixel sections 8A. On the + side in the Y-axis direction of the pixel sections 8A, a fifth temperature sensor 62A is disposed. On the − side in the Y-axis direction and at the center in the X-axis direction of the pixel sections 8A, a sixth temperature sensor 72A is disposed. With this arrangement, it is possible to more accurately detect the temperature of the infrared sensor chip 71A than in a case where five temperature sensors 11A are arranged.

Note that the fifth temperature sensor 62A and the sixth temperature sensor 72A may be disposed at locations shifted from each other in the X-axis direction. With this arrangement, it is possible to more accurately detect distribution of the temperature of the infrared sensor chip 71A.

Note that the pixel sections 8A of the infrared sensor chips 3A, 31A, 41A, 51A, 61A, and 71A of the third to eighth embodiments may correspond to the pixel sections 11 of the infrared sensor chips 3 and 31 of the first and second embodiment. For example, the pixel sections 8A of the infrared sensor chips 3A, 31A, 41A, 51A, 61A, and 71A of the third to eighth embodiments may have bridge sections 14 including the breakage detection wiring 20 and the heater wirings 22 and 32 in a manner similar to the pixel sections 11 of the infrared sensor chips 3 and 31 of the first and second embodiments.

SUMMARY

An infrared sensor chip (3, 31) of a first aspect includes a supporting substrate (13), at least one bridge section (14), and a thermopile wiring (9). The supporting substrate (13) has a cavity (12). The at least one bridge section (14) extends directly above the cavity (12) and has at least one end (15) supported by the supporting substrate (13) and an other end (19). The thermopile wiring (9) is formed in the at least one bridge section (14). The thermopile wiring (9) includes hot junctions (17) and cold junctions (18). The hot junctions (17) are connected to the cold junctions (18). The hot junctions (17) are provided in the at least one bridge section (14). The cold junctions (18) are provided directly above the supporting substrate (13). The at least one bridge section (14) is provided with: at least one breakage detection wiring (20) for detecting breakage of the at least one bridge section (14); and at least one heater wiring (22, 32). The at least one breakage detection wiring (20) is wired along the thermopile wiring (9). The at least one heater wiring (22, 32) is wired such that part of the at least one heater wiring (22, 32) is in an area (21) between the other end (19) of the at least one bridge section (14) and the hot junctions (17).

In an infrared sensor chip (3, 31) of a second aspect referring to the first aspect, the at least one breakage detection wiring (20) includes two first wiring sections (24) and a second wiring section (25). The two first wiring sections (24) extend in a first direction (23) in which the at least one end (15) and the other end (19) are aligned. The second wiring section (25) has both ends connected to ends of the two first wiring sections (24) at the other end (19). The at least one heater wiring (22, 32) includes a lead line section (27) and a heater section (28). The lead line section (27) is wired outside the area (21) and has an end in the area (21). The heater section (28) is connected to an end of the lead line section (27) and is wired in the area (21). The heater section (28) has a resistance value larger than a resistance value of the second wiring section (25).

In an infrared sensor chip (3, 31) of a third aspect referring to the second aspect, the heater section (28) is wired to have at least a meandering part.

In an infrared sensor chip (3, 31) of a fourth aspect referring to the second or third aspect, the heater section (28) is made of polysilicon. The lead line section (27) is made of aluminum.

In an infrared sensor chip (3, 31) of a fifth aspect referring to any one of the first to fourth aspects, the thermopile wiring (9) includes a plurality of thermopile wires (9) wired in the at least one bridge section (14). The at least one breakage detection wiring (20) has a part wired between the plurality of thermopile wires (9).

In an infrared sensor chip (3, 31) of a sixth aspect referring to the fifth aspect, the part (21) of the at least one breakage detection wiring (20) between the plurality of thermopile wires (9) is made of aluminum.

An infrared sensor chip (3, 31) of a seventh aspect referring to any one of the first to sixth aspects includes at least one pixel section (11). The at least one pixel section (11) includes the at least one bridge section (14) including a plurality of bridge sections (14).

In an infrared sensor chip (3, 31) of an eighth aspect referring to the seventh aspect, the at least one breakage detection wiring (20) includes a plurality of breakage detection wirings (20) wired in the plurality of bridge sections (14) and connected to each other above the supporting substrate (13).

In an infrared sensor chip (3, 31) of a ninth aspect referring to the seventh or eighth aspect, each of the plurality of bridge sections (14) is connected to an adjacent one of the plurality of bridge sections (14) by a joint piece (29) provided at the other end (19) of the each of the plurality of bridge sections (14). The at least one heater wiring (22, 32) includes a plurality of heater wirings (22, 32) wired in the plurality of bridge sections (14). The plurality of heater wirings (22, 32) are connected to each other above the joint piece (29).

In an infrared sensor chip (3, 31) of a tenth aspect referring to any one of the seventh to ninth aspects, the at least one pixel section (11) includes a×b pixel sections (11) arranged in a two-dimensional array including "a" rows and "b" columns, where "a"≥2 and "b"≥2.

In an infrared sensor chip (3, 31) of an eleventh aspect referring to the tenth aspect, the at least one breakage detection wiring (20) includes a plurality of breakage detection wirings (20) connected in series to each other between the pixel sections (11) arranged in an identical column.

In an infrared sensor chip (3, 31) of a twelfth aspect referring to the tenth or eleventh aspect, the at least one heater wiring (22, 32) includes a plurality of heater wirings (22, 32) connected in series to each other between the pixel sections (11) arranged in an identical column.

An infrared sensor (1) of a thirteenth aspect includes an infrared sensor chip (3, 31) of any one of the first to twelfth aspects, a process circuit (4), a base (2), a cap (5), and a package (6). The process circuit (4) is configured to process an output of the infrared sensor chip (3, 31). The infrared sensor chip (3, 31) and the process circuit (4) are disposed on the base (2). The cap (5) is provided on the base (2). The package (6) is provided on the base (2) and covers the infrared sensor chip (3, 31), the process circuit (4), and the cap (5).

An infrared sensor (1) of a fourteenth aspect referring to the thirteenth aspect is configured to always detect a change of resistance of the at least one breakage detection wiring (20) while the infrared sensor (1) is being driven.

In an infrared sensor (1) of a fifteenth aspect referring to the thirteenth or fourteenth aspect, when the infrared sensor (1) is driven, the infrared sensor (1) gives electric power to the at least one heater wiring (22, 32) to increase a temperature of the hot junction (17).

An infrared sensor chip (3A, 31A, 41A, 51A, 61A, 71A) of a sixteenth aspect includes a semiconductor substrate (9A), pixel sections (8A), and a temperature sensor (11A). The pixel sections (8A) are provided on the semiconductor substrate (9A) and are a×b pixel sections (8A) arranged in an array which is two dimensional and which includes "a" rows and "b" columns, where a≥2, and b≥2. The temperature sensor (11A) is provided on the semiconductor substrate (9A) and is configured to detect a temperature of the semiconductor substrate (9A).

In an infrared sensor chip (3A, 31A, 41A, 51A, 61A, 71A) of a seventeenth aspect referring to the sixteenth aspect, the temperature sensor (11A) is a diode (20A).

In an infrared sensor chip (3A, 31A, 41A, 51A, 61A, 71A) of an eighteenth aspect referring to the seventeenth aspect, the temperature sensor (11A) further includes a resistor.

In an infrared sensor chip (3A, 31A, 41A, 51A, 61A, 71A) of a nineteenth aspect referring to any one of the sixteenth to eighteenth aspects, the temperature sensor (11A) extends in a direction parallel to a row direction of the pixel sections (8A).

In an infrared sensor chip (3A, 31A, 41A, 51A, 61A, 71A) of a twentieth aspect referring to any one of the sixteenth to eighteenth aspects, the temperature sensor (11A) extends in a direction parallel to a column direction of the pixel sections (8A).

In an infrared sensor chip (3A, 31A, 41A, 51A, 61A, 71A) of a twenty-first aspect referring to any one of the sixteenth to twentieth aspects, the pixel sections (8A) are arranged such that the pixel sections (8A) adjacent to each other are shifted from each other in a column direction.

In an infrared sensor chip (3A, 31A, 41A, 51A, 61A, 71A) of a twenty-second aspect referring to the twenty-first aspect, the temperature sensor (11A) is disposed in a space (10A) formed by shifting the pixel sections (8A) from each other.

An infrared sensor (1A, 32A) of a twenty-third aspect includes the infrared sensor chip (3A, 31A, 41A, 51A, 61A, 71A) of any one of the sixteenth to twenty-second aspects, a base (2A), a process circuit element (4A), and a package (6A). The base (2A) is provided with the infrared sensor chip (3A, 31A, 41A, 51A, 61A, 71A). The process circuit element (4A) is provided on the base (2A). The package (6A) covers the infrared sensor chip (3A, 31A, 41A, 51A, 61A, 71A) and the process circuit element (4A).

In an infrared sensor (1A, 32A) of a twenty-fourth aspect referring to the twenty-third aspect, the temperature sensor (11A) includes a first temperature sensor (12A) and a second temperature sensor (13A).

In an infrared sensor (1A, 32A) of a twenty-fifth aspect referring to the twenty-fourth aspect, the infrared sensor chip (3A, 31A, 41A, 51A, 61A, 71A) and the process circuit element (4A) are aligned with each other. The first temperature sensor (12A) is disposed at a location between the process circuit element (4A) and a center of the pixel sections (8A). The second temperature sensor (13A) is disposed at a location on an opposite side of the center of the pixel sections (8A) from the process circuit element (4A).

In an infrared sensor (1A, 32A) of a twenty-sixth aspect referring to the twenty-fifth aspect, the first temperature sensor (12A) and the second temperature sensor (13A) are arranged at point-symmetric locations about the center of the pixel sections (8A).

In an infrared sensor (1A, 32A) of a twenty-seventh aspect referring to the twenty-fourth aspect, the base (2A) has a recess (33A). The process circuit element (4A) is disposed in the recess (33A). The infrared sensor chip (3A, 31A, 41A, 51A, 61A, 71A) is connected to the base (2A) to cover the recess (33A) at both ends of a row direction of the infrared sensor chip (3A, 31A, 41A, 51A, 61A, 71A). The first temperature sensor (12A) is arranged at an end of the both ends in the row direction of the infrared sensor chip (3A, 31A, 41A, 51A, 61A, 71A) connected to the base (2A). The second temperature sensor (13A) is arranged at a center part in the row direction of the infrared sensor chip (3A, 31A, 41A, 51A, 61A, 71A).

An infrared sensor (1A, 32A) of a twenty-eighth aspect referring to the twenty-fourth aspect further includes a third temperature sensor (42A). The first temperature sensor (12A) and the second temperature sensor (13A) are arranged at point-symmetric locations about a center of the pixel sections (8A).

An infrared sensor (1A, 32A) of a twenty-ninth aspect referring to the twenty-fourth aspect further includes a third temperature sensor (42A) and a fourth temperature sensor (52A). The first to fourth temperature sensors (12A, 13A, 42A, and 52A) are arranged outside of respective four corners of the array of the pixel sections (8A).

An infrared sensor (1A, 32A) of a thirtieth aspect referring to the twenty-ninth aspect further includes a fifth temperature sensor (62A). The fifth temperature sensor (62A) is disposed on an outer side in a column direction of the pixel sections (8A).

An infrared sensor (1A, 32A) of a thirty-first aspect referring to the thirtieth aspect further includes a sixth temperature sensor (72A). The sixth temperature sensor (72A) is disposed in a location on an opposite side of the pixel sections (8A) from the fifth temperature sensor (62A), the location being on an outer side in the column direction of the pixel sections (8A).

An infrared sensor (1A, 32A) of a thirty-second aspect referring to the twenty-fourth aspect further includes a third temperature sensor (42A) and a fourth temperature sensor (52A). The first temperature sensor (12A) and the second temperature sensor (13A) are disposed on an outer side in a row direction of the pixel sections (8A) such that the pixel sections (8A) are disposed between the first temperature sensor (12A) and the second temperature sensor (13A). The third temperature sensor (42A) and the fourth temperature sensor (52A) are disposed on the outer side in a column direction of the pixel sections (8A) such that the pixel sections (8A) are disposed between the third temperature sensor (42A) and the fourth temperature sensor (52A).

INDUSTRIAL APPLICABILITY

The present disclosure enables a self-diagnostic function of an infrared sensor chip to be improved and is thus useful, for example, in an air conditioning control device configured to change a way of control depending on the temperature of a person.

The present disclosure includes a temperature sensor which is formed on a substrate of an infrared sensor chip and which is configured to detect a temperature of the infrared sensor chip. Thus, the present disclosure enables detection accuracy of infrared radiation to be improved without increasing the size of the infrared sensor. The present disclosure is thus useful, for example, in an air conditioning control device configured to change a way of control depending on the temperature of a person.

REFERENCE SIGNS LIST

1 INFRARED SENSOR
2 BASE
3, 31 INFRARED SENSOR CHIP
4 PROCESS CIRCUIT
5 CAP
6 PACKAGE
7 OPENING
8 LENS
9 THERMOPILE WIRING
10 THIN FILM STRUCTURE SECTION
11 PIXEL SECTION
12 CAVITY
13 SUPPORTING SUBSTRATE
14 BRIDGE SECTION
15 ONE END
16 SLIT
17 HOT JUNCTION
18 COLD JUNCTION
19 THE OTHER END
20 BREAKAGE DETECTION WIRING
21 AREA
22, 32 HEATER WIRING
23 FIRST DIRECTION
24 FIRST WIRING SECTION
25 SECOND WIRING SECTION
26 SECOND DIRECTION
27 LEAD LINE SECTION
28 HEATER SECTION
29 JOINT PIECE
1A, 32A INFRARED SENSOR
2A BASE
3A, 31A, 41A, 51A, 61A, 71A INFRARED SENSOR CHIP
4A PROCESS CIRCUIT ELEMENT
5A CAP
6A PACKAGE
7A LENS
8A PIXEL SECTION
9A SEMICONDUCTOR SUBSTRATE
10A SPACE
11A TEMPERATURE SENSOR
12A FIRST TEMPERATURE SENSOR
13A SECOND TEMPERATURE SENSOR
14A THERMAL OXIDE FILM
15A SiN FILM
16A p-WELL
17A MASK
18A CHANNEL STOPPER
19A POLY-Si FILM
20A DIODE
21A p-TYPE THERMOPILE ELEMENT
22A n-TYPE THERMOPILE ELEMENT
23A INTERLAYER INSULATION FILM
24A WIRING
25A PASSIVATION FILM
26A BRIDGE OPENING
27A CAVITY
28A BRIDGE
29A RESISTOR
33A RECESS
42A THIRD TEMPERATURE SENSOR
52A FOURTH TEMPERATURE SENSOR
62A FIFTH TEMPERATURE SENSOR
72A SIXTH TEMPERATURE SENSOR

The invention claimed is:

1. An infrared sensor chip, comprising:
a supporting substrate having a cavity;
at least one bridge section extending directly above the cavity and having at least one end supported by the supporting substrate and an other end, and
a thermopile wiring formed in the at least one bridge section, the thermopile wiring including hot junctions and cold junctions, the hot junctions being connected to the cold junctions, the hot junctions being provided in the at least one bridge section, the cold junctions being provided directly above the supporting substrate,
the at least one bridge section being provided with: at least one breakage detection wiring for detecting breakage of the at least one bridge section; and at least one heater wiring, the at least one breakage detection wiring being wired along the thermopile wiring, the at least one heater wiring being wired such that part of the at least one heater wiring is in an area between the other end of the at least one bridge section and the hot junctions.

2. The infrared sensor chip of claim 1, wherein
the at least one breakage detection wiring includes
two first wiring sections extending in a first direction in which the at least one end and the other end are aligned and
a second wiring section having both ends connected to ends of the two first wiring sections at the other end,
the at least one heater wiring includes
a lead line section wired outside the area and having an end in the area and
a heater section connected to an end of the lead line section and wired in the area, wherein
the heater section has a resistance value larger than a resistance value of the second wiring section.

3. The infrared sensor chip of claim 2, wherein
the heater section is wired to have at least a meandering part.

4. The infrared sensor chip of claim 2, wherein
the heater section is made of polysilicon, and
the lead line section is made of aluminum.

5. The infrared sensor chip of claim 1, wherein
the thermopile wiring includes a plurality of thermopile wires wired in the at least one bridge section, and
the at least one breakage detection wiring has a part wired between the plurality of thermopile wires.

6. The infrared sensor chip of claim 5, wherein
the part of the at least one breakage detection wiring between the plurality of thermopile wires is made of aluminum.

7. The infrared sensor chip of claim 1 further comprising at least one pixel section including the at least one bridge section including a plurality of bridge sections.

8. The infrared sensor chip of claim 7, wherein
the at least one breakage detection wiring includes a plurality of breakage detection wirings wired in the plurality of bridge sections and connected to each other above the supporting substrate.

9. The infrared sensor chip of claim 7, wherein each of the plurality of bridge sections is connected to an adjacent one of the plurality of bridge sections by a joint piece provided at the other end of the each of the plurality of bridge sections, and the at least one heater wiring includes a plurality of heater wirings wired in the plurality of bridge sections, the plurality of heater wirings being connected to each other above the joint piece.

10. The infrared sensor chip of claim 7, wherein the at least one pixel section includes a×b pixel sections arranged in a two-dimensional array including "a" rows and "b" columns, where a≥2 and b≥2.

11. The infrared sensor chip of claim 10, wherein the at least one breakage detection wiring includes a plurality of breakage detection wirings connected in series to each other between the pixel sections arranged in an identical column.

12. The infrared sensor chip of claim 10, wherein the at least one heater wiring includes a plurality of heater wiring connected in series to each other between the pixel sections arranged in an identical column.

13. An infrared sensor, comprising:

the infrared sensor chip of claim 1;

a process circuit configured to process an output of the infrared sensor chip;

a base on which the infrared sensor chip and the process circuit are disposed;

a cap provided on the base; and a package provided on the base and covering the infrared sensor chip, the process circuit, and the cap.

14. The infrared sensor of claim 13, the infrared sensor being configured to always detect a change of resistance of the at least one breakage detection wiring while the infrared sensor is being driven.

15. The infrared sensor of claim 13, wherein when the infrared sensor is driven, the infrared sensor gives electric power to the at least one heater wiring to increase a temperature of the hot junction.

* * * * *